(12) United States Patent
Guo et al.

(10) Patent No.: US 11,382,245 B2
(45) Date of Patent: Jul. 5, 2022

(54) ULTRA-THIN CONDUCTOR BASED SEMI-TRANSPARENT ELECTROMAGNETIC INTERFERENCE SHIELDING

(71) Applicant: THE REGENTS OF THE UNIVERSITY OF MICHIGAN, Ann Arbor, MI (US)

(72) Inventors: Lingjie Jay Guo, Ann Arbor, MI (US); Heyan Wang, Harbin (CN)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 17/435,540

(22) PCT Filed: Feb. 28, 2020

(86) PCT No.: PCT/US2020/020462
§ 371 (c)(1),
(2) Date: Sep. 1, 2021

(87) PCT Pub. No.: WO2020/180715
PCT Pub. Date: Sep. 10, 2020

(65) Prior Publication Data
US 2022/0046836 A1    Feb. 10, 2022

Related U.S. Application Data

(60) Provisional application No. 62/812,706, filed on Mar. 1, 2019.

(51) Int. Cl.
*F03G 4/00*    (2006.01)
*F16L 21/035*   (2006.01)
(Continued)

(52) U.S. Cl.
CPC ......... *H05K 9/0084* (2013.01); *H05K 9/0088* (2013.01); *H05K 9/0094* (2013.01);
(Continued)

(58) Field of Classification Search
CPC ........... F03G 4/00; F16L 21/035; F24T 10/15; H01B 1/02; H05K 1/02; H05K 9/0084;
(Continued)

(56) References Cited

U.S. PATENT DOCUMENTS 5,510,173 A    4/1996  Pass et al.
5,744,227 A    4/1998  Bright et al.
(Continued)

FOREIGN PATENT DOCUMENTS

JP    2004031876 A  *  1/2004  ............. B29C 59/04
JP    2007235115 A  *  9/2007  ........... H05K 9/0096
(Continued)

OTHER PUBLICATIONS

EMI Shielded Conductive Film: Product Information, TECKFILM™, TB1088 EN 0515, Parker Hannifin Corporation (2017), 2 pages.
(Continued)

*Primary Examiner* — Timothy J Thompson
*Assistant Examiner* — Guillermo J Egoavil
(74) *Attorney, Agent, or Firm* — Harness, Dickey & Pierce, P.L.C.

(57) ABSTRACT

Electromagnetic interference (EMI) shields and methods for broadband EMI shielding are provided. An EMI shield disposed in a path of electromagnetic radiation blocks a broad range of frequencies (>about 800 MHz to <about 90 GHz) to a shielding efficiency of >to 20 dB, while transmitting wavelengths in a visible range to an average transmission efficiency of >about 85% through the electromagnetic shield. The shield includes a flexible stack comprising a continuous ultrathin metal film comprising silver (Ag) and
(Continued)

copper (Cu) and two antireflection dielectric layers disposed on either side of the ultrathin metal film. The shield may also include multiple stacks or an optional graphene layer that may be spaced apart from the flexible stack to achieve radiofrequency (RE) absorption, which provides additional form of EMI shielding. The EMI shield can be made via roll-to-roll sputtering.

26 Claims, 16 Drawing Sheets

(51) Int. Cl.
*F24T 10/15* (2018.01)
*H01B 1/02* (2006.01)
*H05K 1/02* (2006.01)
*H05K 9/00* (2006.01)

(52) U.S. Cl.
CPC .................. *H01B 1/02* (2013.01); *H05K 1/02* (2013.01); *H05K 9/00* (2013.01)

(58) Field of Classification Search
CPC ...... H05K 9/0088; H05K 9/0094; H05K 9/00; Y02E 10/10
USPC ......... 361/818; 174/382, 377, 391; 428/336, 428/626, 457
See application file for complete search history.

(56) References Cited

U.S. PATENT DOCUMENTS

| | | | |
|---|---|---|---|
| 5,763,063 A | 6/1998 | Pass et al. | |
| 5,783,049 A | 7/1998 | Bright et al. | |
| 6,255,003 B1 | 7/2001 | Woodard et al. | |
| 6,818,291 B2 | 11/2004 | Funkenbusch et al. | |
| 7,135,643 B2 | 11/2006 | Van Haaster et al. | |
| 7,351,479 B2 | 4/2008 | Funkenbusch et al. | |
| 9,241,433 B2 | 1/2016 | Shah et al. | |
| 9,261,753 B2 | 2/2016 | Guo et al. | |
| 2011/0100466 A1* | 5/2011 | Kuo ...................... H01L 51/447 | 438/82 |
| 2012/0129090 A1* | 5/2012 | Mamak .................... C09C 1/00 | 106/287.18 |
| 2015/0342031 A1 | 11/2015 | Song et al. | |
| 2016/0165768 A1 | 6/2016 | Tanaka | |
| 2017/0200526 A1 | 7/2017 | Guo et al. | |
| 2019/0219881 A1* | 7/2019 | Shrivastava ............ H02J 50/00 | |

FOREIGN PATENT DOCUMENTS

| | | | | |
|---|---|---|---|---|
| JP | 2012142500 A | * | 7/2012 | ............. H01B 13/00 |
| TW | I414097 B | * | 11/2013 | ........... H01L 51/424 |
| TW | I533461 B | * | 5/2016 | ............. H01B 13/00 |
| WO | WO-2003107729 A1 | | 12/2003 | |

OTHER PUBLICATIONS

Transparent Conductive Fil: WINAL Series, Data Sheet, Kitagawa Industries America, Inc. [online] [Retrieved from the Internet: <URL: http://kgs-ind.com/products/emc/emi-shielding/emi-window-film-touch-screen-film/emi-shielding-transparent-conductive-film-winal-100-020/>, 1 page.

Transparent shielding foil 9900: Product Information, Holland Shielding System BV (Feb. 18, 2019) [online] [retrieved on Feb. 21, 2019], Retrieved from the Internet: <URL: https://hollandshielding.com/Transparent-shielding-foil-9900>.

Radio Clear | High Transparency, High Shielding Film (Cat. #A1269). Datasheet [online]. FilterEMF, 2018 [retrieved on Feb. 21, 2019], Retrieved from the Internet: <URL: https://www.filteremf.com/buy/radio-clear-high-transparency-high-shielding-film/>.

International Search Report and Written Opinion of the International Searching Authority issued in PCT/US2020/020462, dated May 22, 2020; ISA/US.

* cited by examiner

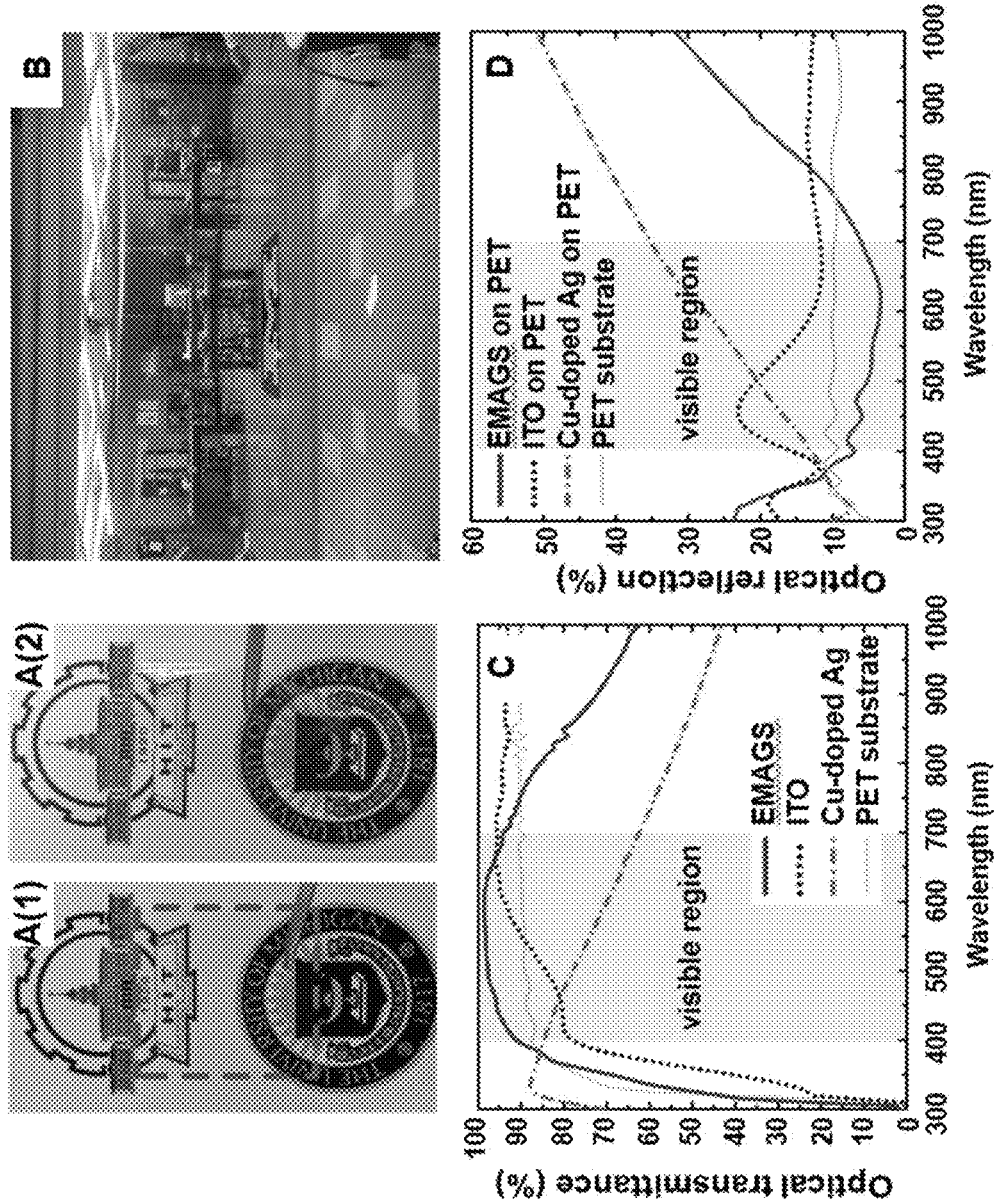
FIGS. 7A(1)–7D

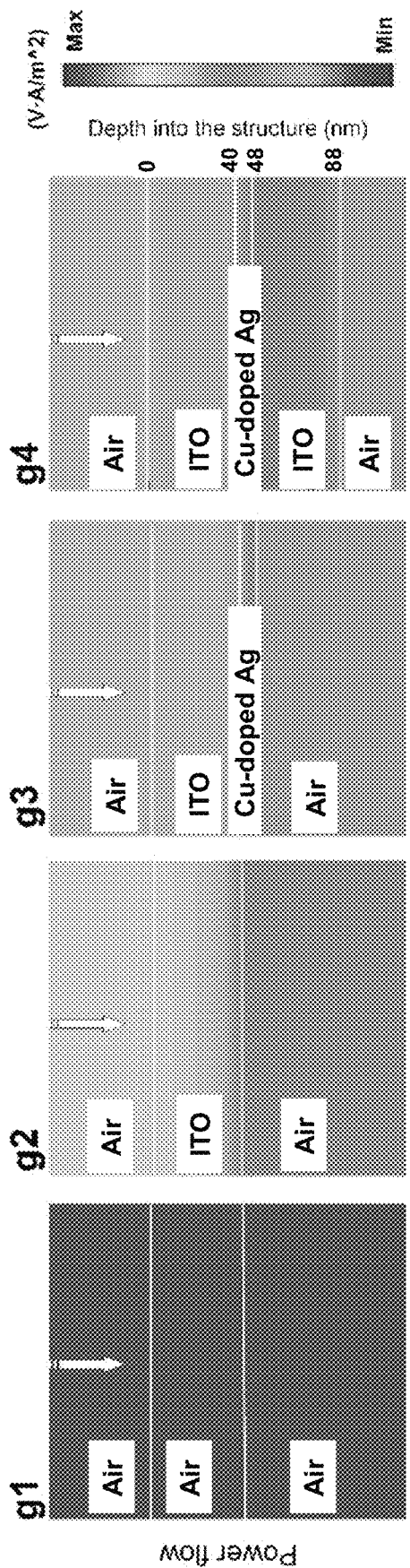
FIGS. 9G(1)–9G(4)

ULTRA-THIN CONDUCTOR BASED SEMI-TRANSPARENT ELECTROMAGNETIC INTERFERENCE SHIELDING

CROSS-REFERENCE TO RELATED APPLICATIONS

This application is a 371 U.S. National Phase of International Application No. PCT/US2020/020462 filed on Feb. 28, 2020, which claims the benefit of U.S. Provisional Application No. 62/812,706, filed on Mar. 1, 2019. The entire disclosures of the above applications are incorporated herein by reference.

FIELD

The present disclosure relates to methods for broadband electromagnetic interference (EMI) shielding while transmitting visible light by use of an electromagnetic shield including a flexible stack having a continuous ultrathin metal film comprising silver (Ag) and copper (Cu) and at least two layers comprising an electrically conductive dielectric material.

BACKGROUND

This section provides background information related to the present disclosure which is not necessarily prior art.

The significant advance of information technology, especially the rapid rise of modern electronics employing microwave wireless communication and highly integrated circuits, has created significant electromagnetic energy pollution also known as electromagnetic interference (EMI). EMI can cause unacceptable malfunction of electronic systems used in a wide range of industrial, civil, commercial, and scientific research applications, such as aerospace, aircraft, automobile, and satellite communication instruments. In addition, it is reported that long-term exposure to the intensive electromagnetic radiation may pose health hazards, including cancer and insomnia. Therefore, minimizing or eliminating exposure to adverse electromagnetic waves to protect electronic system operations, including sensitive circuits, and to preserve a healthy living environment are advantageous.

As such, demand has increased for high-performance electromagnetic interference (EMI) shielding, such as absorbers in the microwave frequencies (microwave absorbers (MAs)) that can reduce undesirable radiation. Microwave absorbers (MAs) can also enhance energy harvesting efficiency and improve detector sensitivity and the like. In view of the prevalent use of various optoelectronic devices, including wearable sensors and smart phones and the associated complex electromagnetic environment, EMI shielding technology has become even more important. However, many conventional electromagnetic shield devices are opaque, limiting their use in optical applications that require high visible transparency. Thus, in many applications, such as windows and displays for aircraft, aerospace exploration facilities, liquid crystal displays (LCDs), mobile communication devices, and optical detecting devices used in medical and electronic safety areas, it would be desirable for electromagnetic shields/microwave absorbers to provide high visible light transmittance and concurrently attenuate microwave transmission.

Recently, by engineering materials structures achieving so-called meta-materials, it is possible to manipulate the effective permittivity and permeability, thereby controlling microwave responses, such as transmission and reflection. It has been shown that semi-transparent microwave meta-material absorbers can be obtained through minimizing reflection by impedance matching. Although meta-materials offer great potential for perfect microwave absorption, their applications are largely limited by the undesired narrow-band performance, meaning they can only block or attenuate narrow select wavelength ranges. However, it is advantageous to reduce electromagnetic interference (EMI) across a broad radio frequency band of wavelengths, rather than a narrow band, to eliminate adverse effects of increasingly complex electromagnetic environment. Moreover, poor mechanical flexibility and fabrication complexity significantly limit use of meta-materials and other similar absorbers in flexible electronics. It would be desirable to develop EMI shielding devices with both high optical transparency and strong electromagnetic wave attenuation. Further, good mechanical flexibility is highly desired so that EMI shielding devices can be manufactured in a scalable and low-cost fashion.

SUMMARY

This section provides a general summary of the disclosure, and is not a comprehensive disclosure of its full scope or all of its features.

In certain aspects, the present disclosure relates to a method for broadband electromagnetic interference (EMI) shielding comprising disposing an electromagnetic shield in a transmission path of electromagnetic radiation. The method includes blocking a range of frequencies of greater than or equal to about 600 MHz to less than or equal to about 90 GHz to a shielding efficiency of greater than or equal to 20 dB with the electromagnetic shield, while transmitting a range of wavelengths in a visible range of greater than or equal to about 390 nm to less than or equal to about 740 nm to an average visible transmission efficiency of greater than or equal to about 65% through the electromagnetic shield. The electromagnetic shield includes a flexible stack comprising a continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths. The flexible stack also includes a first conductive layer disposed adjacent to the first side of the continuous metal film. The first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. The second conductive layer is disposed adjacent to the second side of the continuous metal film. The second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof.

In one aspect, the electromagnetic shield further comprises a graphene layer.

In one aspect, the graphene layer comprises at least one dopant.

In one aspect, the electromagnetic shield further comprises at least one spacer layer comprising a dielectric material disposed between the graphene layer and the second conductive layer of the flexible stack.

In one aspect, the at least one spacer layer has a thickness corresponding to a quarter of peak wavelength of electromagnetic radiation in the range of frequencies of greater than or equal to about 800 MHz to less than or equal to about 90 GHz.

In one aspect, the blocking is for the range of frequencies of greater than or equal to 8 GHz to less than or equal to about 40 GHz to a shielding efficiency of greater than or equal to 26 dB.

In one aspect, the electromagnetic shield further comprises a graphene layer that together with the flexible stack defines a resonator cavity, so that the blocking comprises absorbing the range of frequencies of greater than or equal to about 800 MHz to less than or equal to about 90 GHz within the resonator cavity so that a reflectivity of the electromagnetic shield is less than or equal to about 1%.

In one aspect, the shielding efficiency is greater than or equal to 20 dB while the average visible transmission efficiency is greater than or equal to about 85%.

In one aspect, the shielding efficiency is greater than or equal to 30 dB while the average visible transmission efficiency is greater than or equal to about 80%.

In one aspect, the shielding efficiency is greater than or equal to 50 dB while the average visible transmission efficiency is greater than or equal to about 65%.

In one aspect, the first conductive layer has a thickness of less than or equal to about 45 nm and the second conductive layer has a thickness of less than or equal to about 45 nm.

In one aspect, the flexible stack further comprises a substrate that is transmissive to the range of wavelengths.

In one aspect, the flexible stack has a sheet resistance ($R_s$) of less than or equal to 20 Ohm/square after greater than or equal to about 250 cycles of bending.

The present disclosure also relates to a method for broadband electromagnetic shielding comprising disposing an electromagnetic shield in a transmission path of electromagnetic radiation. The electromagnetic shield blocks a range of frequencies of greater than or equal to about 800 MHz to less than or equal to about 90 GHz to a shielding efficiency of greater than or equal to 20 dB, while transmitting a range of wavelengths in a visible range of greater than or equal to about 390 nm to less than or equal to about 740 nm to an average visible transmission efficiency of greater than or equal to about 65% through the electromagnetic shield. The electromagnetic shield comprises a first flexible stack and a second flexible stack. The first flexible stack comprises a first continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths. The first flexible stack also comprises a first conductive layer disposed on the first side of the first continuous metal film. The first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. A second conductive layer is disposed on the second side of the first continuous metal film. The second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. The second flexible stack comprises a second continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths. The second flexible stack also comprise a third layer disposed on the first side of the second continuous metal film. The third layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. The second flexible stack also comprises a fourth layer disposed on the second side of the second continuous metal film. The fourth layer comprises a conductive dielectric material selected from the group consisting of: indium tin oxide, aluminum tin oxide, indium zinc oxide, fluorine-doped tin oxide, poly(3, 4-ethylenedioxythiophene) (PEDOT), and mixtures thereof. A spacing layer comprising a dielectric material is also disposed between the first flexible stack and the second flexible stack.

In one aspect, the spacing layer has a thickness corresponding to a quarter of peak wavelength of electromagnetic radiation in the range of frequencies of greater than or equal to about 800 MHz to less than or equal to about 90 GHz.

In one aspect, the shielding efficiency is greater than or equal to 30 dB while the average visible transmission efficiency is greater than or equal to about 80%.

In one aspect, the shielding efficiency is greater than or equal to 50 dB while the average visible transmission efficiency is greater than or equal to about 65%.

The present disclosure also relates to an electromagnetic interference (EMI) shield comprising a first flexible stack that comprises a first continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to a range of wavelengths in a visible range of greater than or equal to about 390 nm to less than or equal to about 740 nm. The first flexible stack also comprises a first conductive layer disposed on the first side of the first continuous metal film. The first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. The first flexible stack also comprises a second conductive layer disposed on the second side of the first continuous metal film. The second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. A second flexible stack is also included that comprises a second continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths in the visible range of greater than or equal to about 390 nm to less than or equal to about 740 nm. The second flexible stack also comprises a third layer disposed on the first side of the second continuous metal film. The third layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. A fourth layer is disposed on the second side of the second continuous metal film. The fourth layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. A spacing layer comprising a dielectric material is disposed between the first flexible stack and the second flexible stack.

In yet other aspects, the present disclosure relates to an electromagnetic interference (EMI) shield comprising a continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square. A first conductive layer is disposed in contact with the first side of the continuous metal film. The first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. A second conductive layer is disposed in contact with the second side of the continuous metal film, wherein the second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof. A spacing layer comprises a dielectric material adjacent to the second conductive layer. A graphene layer is adjacent to the spacing layer.

In one aspect, the electromagnetic interference (EMI) shield further comprises an electrical gating system comprising a first terminal in electrical communication with the graphene layer, a second terminal in electrical communication with the continuous metal film, and a voltage source in electrical communication with the first terminal and the second terminal.

In one aspect, the graphene layer comprises at least one dopant.

In one aspect, the graphene layer is a first graphene layer and the electromagnetic interference (EMI) shield further comprises a second graphene layer.

In one aspect, the spacing layer has a thickness corresponding to a quarter of peak wavelength of electromagnetic radiation in the range of frequencies of greater than or equal to about 800 MHz to less than or equal to about 90 GHz.

In one aspect, the continuous metal film has a thickness of less than or equal to about 10 nm, the first conductive layer has a thickness of less than or equal to about 45 nm and the second conductive layer has a thickness of less than or equal to about 45 nm.

In one aspect, the shielding efficiency of the electromagnetic interference (EMI) shield is greater than or equal to 30 dB while an average transmission efficiency for a range of wavelengths in a visible range of greater than or equal to about 390 nm to less than or equal to about 740 nm is greater than or equal to about 80% through electromagnetic interference (EMI) shield.

The present disclosure also relates to a method for broadband electromagnetic shielding comprising disposing an electromagnetic shield in a transmission path of electromagnetic radiation to block a range of frequencies of greater than or equal to about 800 MHz to less than or equal to about 90 GHz to a shielding efficiency of greater than or equal to 30 dB while transmitting a range of wavelengths in a visible range of greater than or equal to about 390 nm to less than or equal to about 740 nm to an average transmission efficiency of greater than or equal to about 80% through the electromagnetic shield. The electromagnetic shield comprises a continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square. A first conductive layer is disposed in contact with the first side of the continuous metal film. The first conductive layer comprises a conductive material selected from the group consisting of: indium tin oxide, aluminum zinc oxide (AZO), indium zinc oxide (IZO), fluorine-doped tin oxide (FTO), poly(3,4-ethylenedioxythiophene) (PEDOT), and mixtures thereof. A second conductive layer is disposed in contact with the second side of the continuous metal film. The second conductive layer comprises a conductive material selected from the group consisting of: indium tin oxide, aluminum zinc oxide (AZO), indium zinc oxide (IZO), fluorine-doped tin oxide (FTO), poly(3,4-ethylenedioxythiophene) (PEDOT), and mixtures thereof. The electromagnetic shield also includes a spacing layer comprising a dielectric material adjacent to the second conductive layer and a graphene layer adjacent to the spacing layer.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
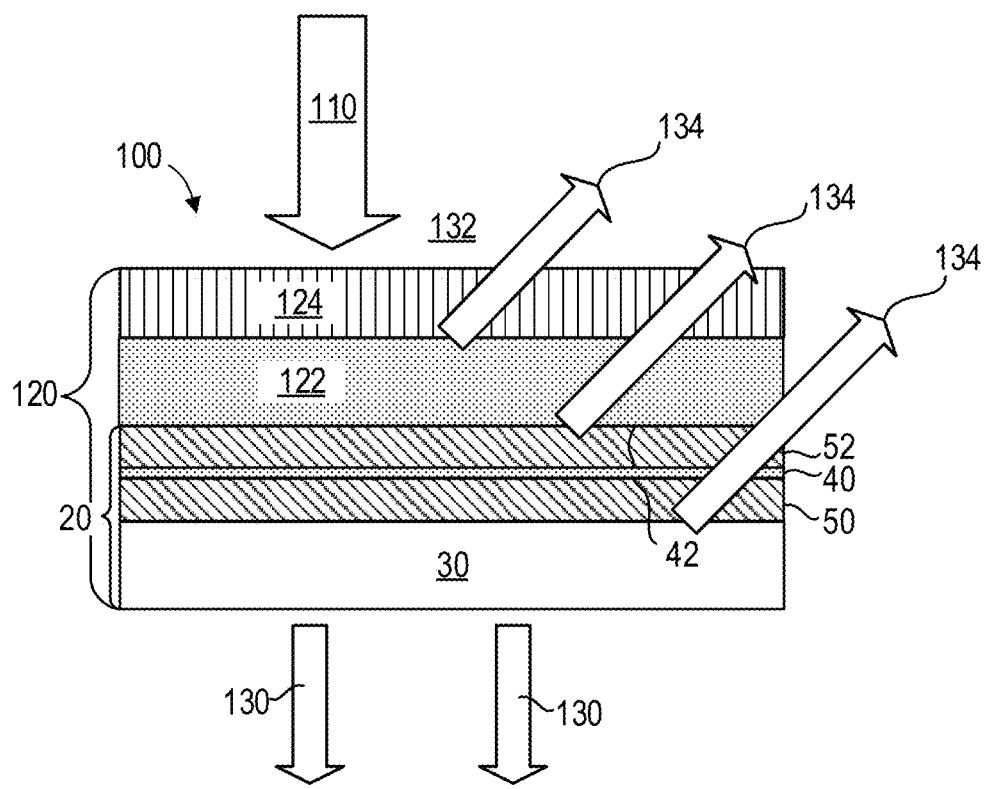
FIG. 2 shows a schematic of a transparent electromagnetic interference (EMI) shield device having a stack assembly defining a resonator cavity including a stack like that in FIG. 1 and further comprising a spacing layer and a second electrically conductive and lossy layer prepared in accordance with certain aspects of the present disclosure.
Figure 3:
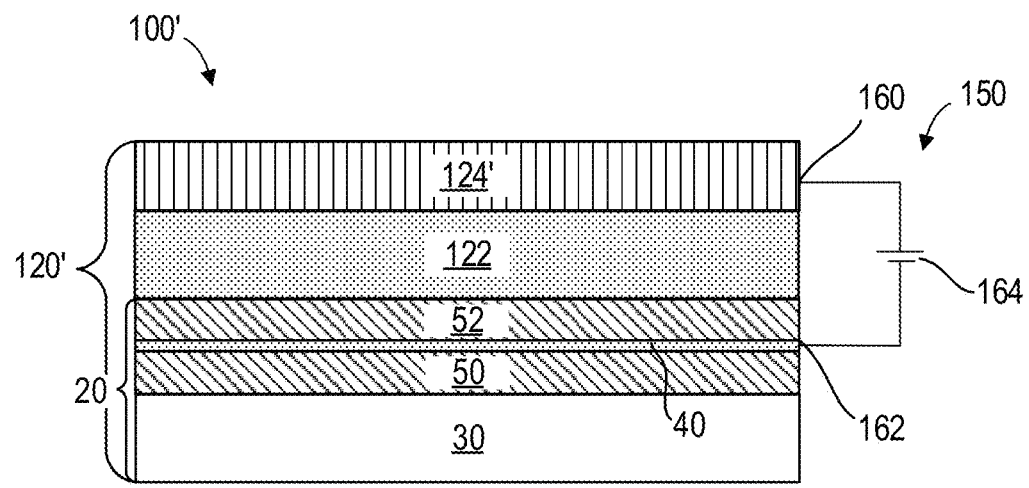

FIG. 3 shows a schematic of a transparent electromagnetic interference (EMI) shield device having a stack assembly defining a resonator cavity like that in FIG. 2, but further comprising an electrical gating system in electrical communication with an ultrathin electrically conductive silver alloy and a second electrically conductive layer prepared in accordance with certain aspects of the present disclosure.

Figure 4:
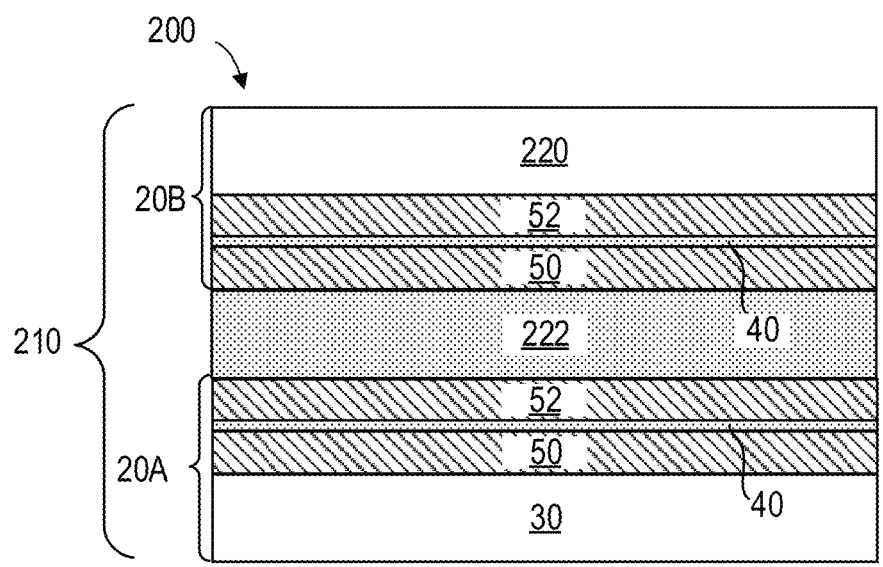

FIG. 4 shows a schematic of a transparent electromagnetic interference (EMI) shield device having dual stacks each comprising an ultrathin electrically conductive silver alloy flanked by a first electrically conductive transparent antireflection layer and a second electrically conductive transparent antireflection layer in accordance with certain aspects of the present disclosure.

Figure 5:
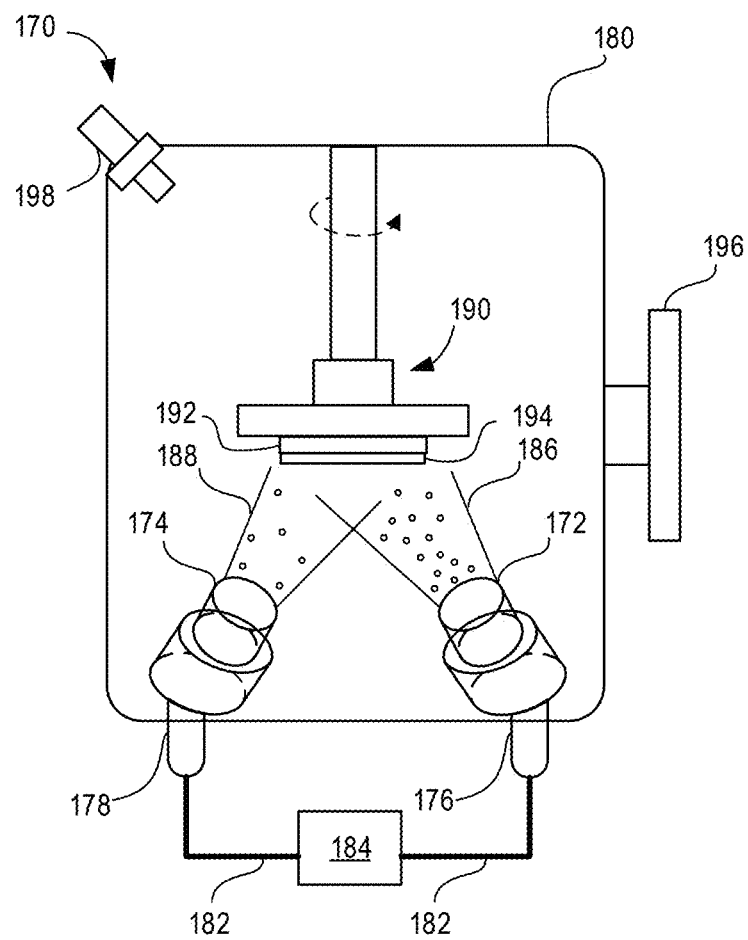

FIG. 5 shows an apparatus for co-sputtering silver and a conductive metal, such as copper, to form a continuous ultrathin electrically conductive silver alloy for use with certain variations of the electromagnetic interference shielding devices of the present disclosure.

Figures 6A, 6B, 6C, 6D, 6E:
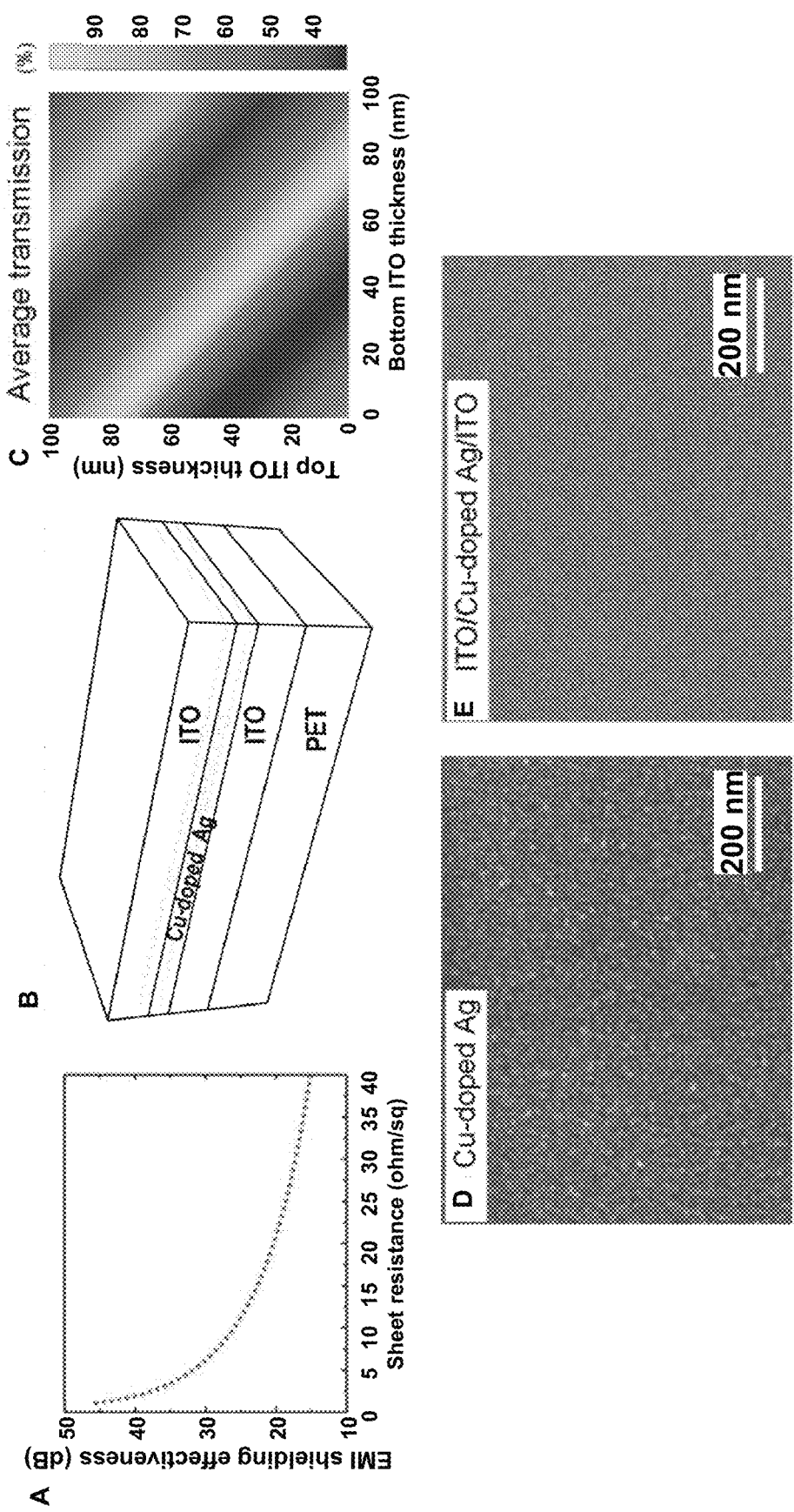

FIGS. 6A-6E. FIG. 6A shows calculated electromagnetic interference (EMI) shielding effectiveness (SE) as a function of sheet resistance ($R_s$) for ultrathin silver alloy films used in various aspects of the present disclosure. FIG. 6B shows a schematic of a stack comprising two ITO layers surrounding a Cu-doped Ag layer on a PET substrate. FIG. 6C shows calculated average visible transmittance of an electromagnetic interference shielding device (EMAGS) film for various thicknesses of the top and bottom ITO layers with an 8 nm thick Cu-doped Ag. FIGS. 6D and 6E show SEM images of an 8 nm Cu-doped Ag film and a EMAGS film stack prepared in accordance with certain aspects of the present disclosure.

FIGS. 7A(1)-7D. FIG. 7A(1) shows an EMAGS stack film prepared in accordance with certain aspects of the present disclosure with good transparency. FIG. 7A(2) is an EMAGS film while being folded, showing outstanding flexibility. FIG. 7B shows a large-area (200 cm×50 cm) transparent EMAGS stack film on PET fabricated by a roll-to-roll process in accordance with certain aspects of the present disclosure. FIG. 7C shows transmittance and FIG. 7D shows reflection spectra of the EMAGS stack, Cu-doped Ag (8 nm), ITO (40 nm), and PET substrate from 300-1000 nm.

Figures 8A, 8B, 8C, 8D:
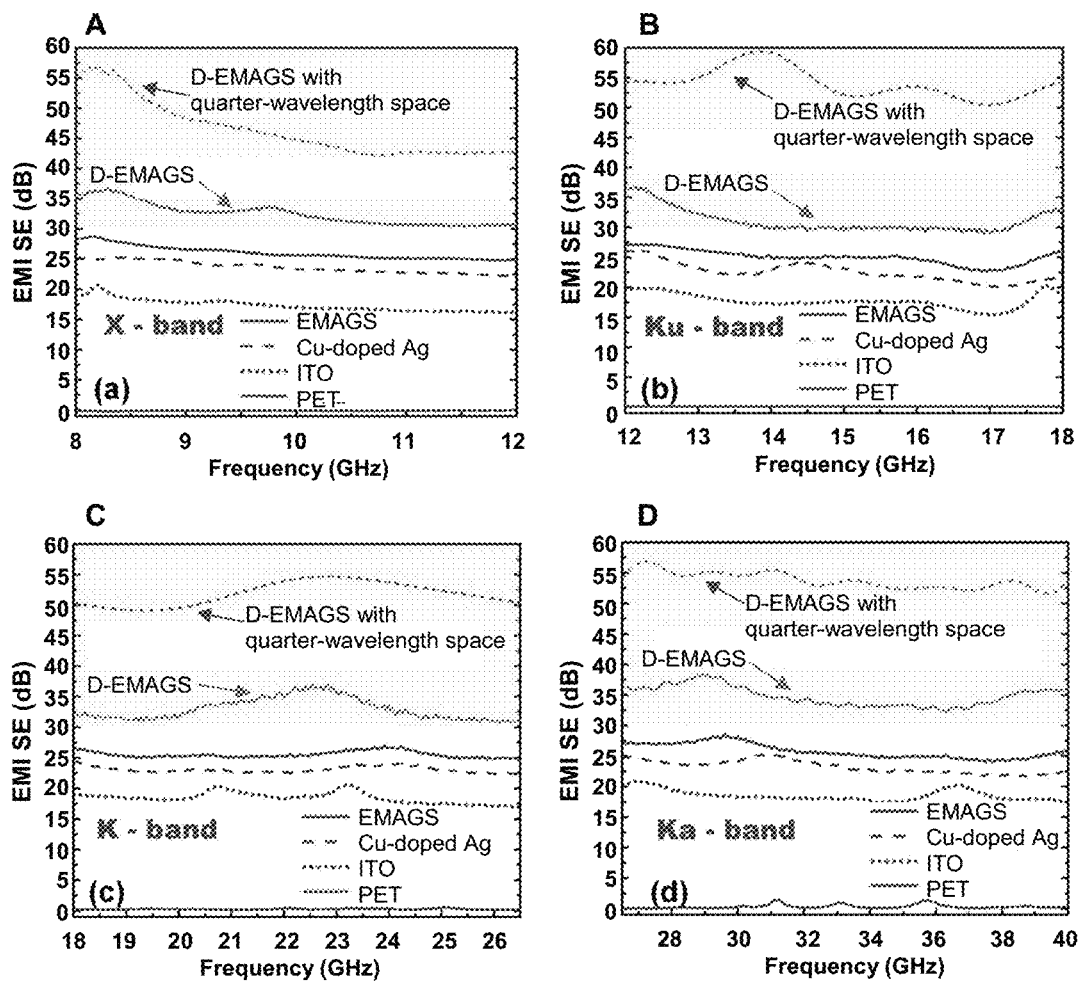

FIGS. 8A-8D show measured EMI SE results of an EMAGS stack, a double-stack EMAGS assembly, a double-stack EMAGS separated by a quarter-wavelength spacing layer, Cu-doped Ag (8 nm), ITO (40 nm) and PET films. FIG. 8A shows X-band (8-12 GHz) results, FIG. 8B shows $K_u$-band results (12-18 GHz), FIG. 8C shows K-band (18-26.5 GHz) results, and FIG. 8D shows $K_a$-band results (26.5-40 GHz).

Figures 9A, 9B, 9C, 9D, 9E, 9F:
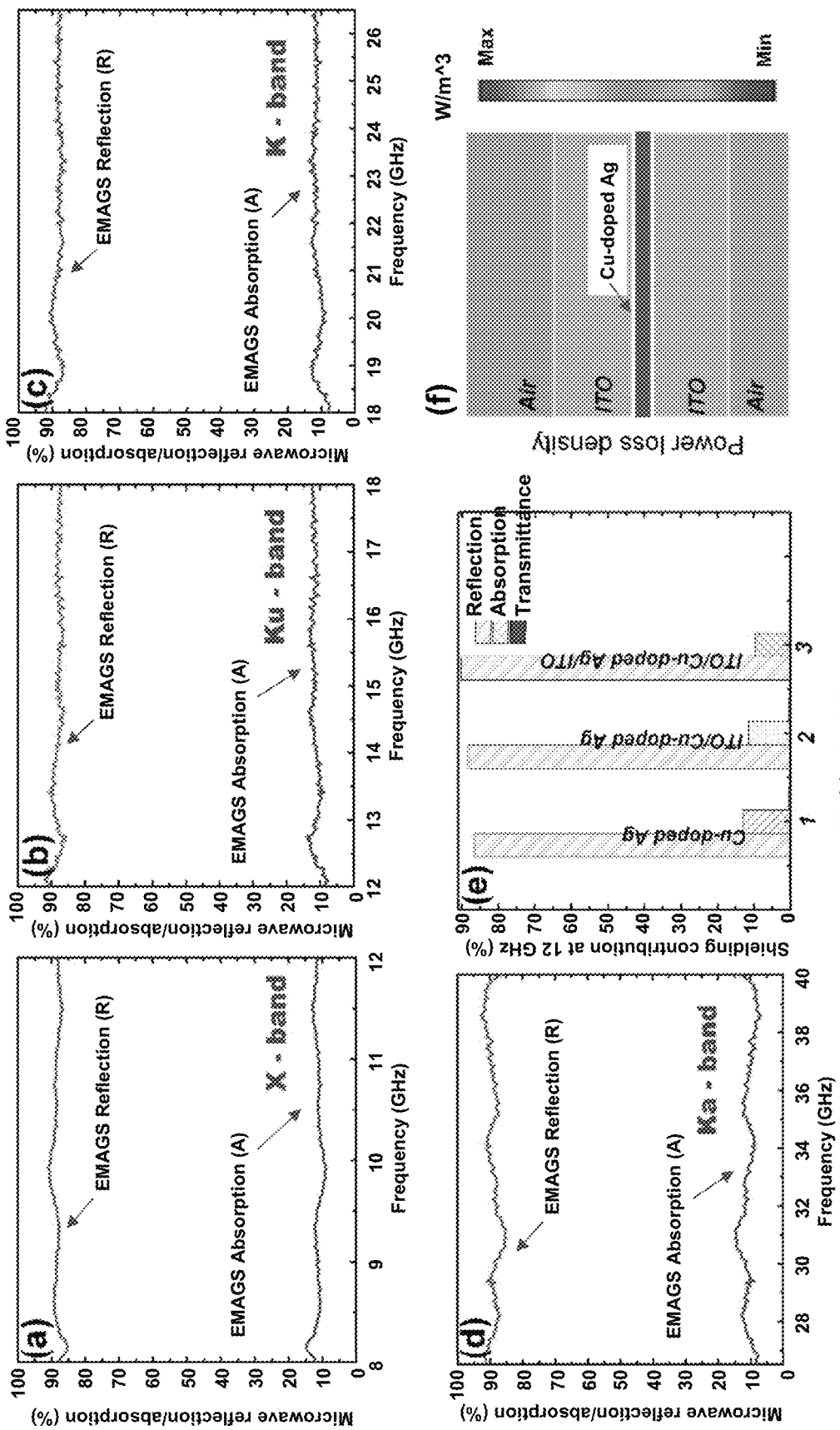

FIGS. 9A-9G(4) show the measured microwave reflection (R) and absorption (A) of electromagnetic interference shield EMAGS stack films prepared in accordance with certain aspects of the present disclosure as a function of incident frequencies. More specifically, the measured microwave reflection (R) and absorption (A) of electromagnetic interference shield EMAGS stack film in the X-band (8-12 GHz)(FIG. 9A), $K_u$-band (12-18 GHz)(FIG. 9B), K-band (18-26.5 GHz)(FIG. 9C), $K_a$-band (26.5-40 GHz)(FIG. 9D). FIG. 9E shows calculated power loss density within each layer of the ITO/Cu-doped Ag/ITO structure at 12 GHz using CST microwave studio. FIG. 9F shows calculated shielding contributions from R and A of the 1) Cu-doped Ag, 2) ITO/Cu-doped Ag, and 3) ITO/Cu-doped Ag/ITO structures. Simulated power flow within the structure of the FIGS. 9G(1) Air, 9G(2) ITO, 9G(3) ITO/Cu-doped Ag, and 9G(4) ITO/Cu-doped Ag/ITO structures at 12 GHz using CST microwave studio.

Figures 10A, 10B, 10C, 10D:
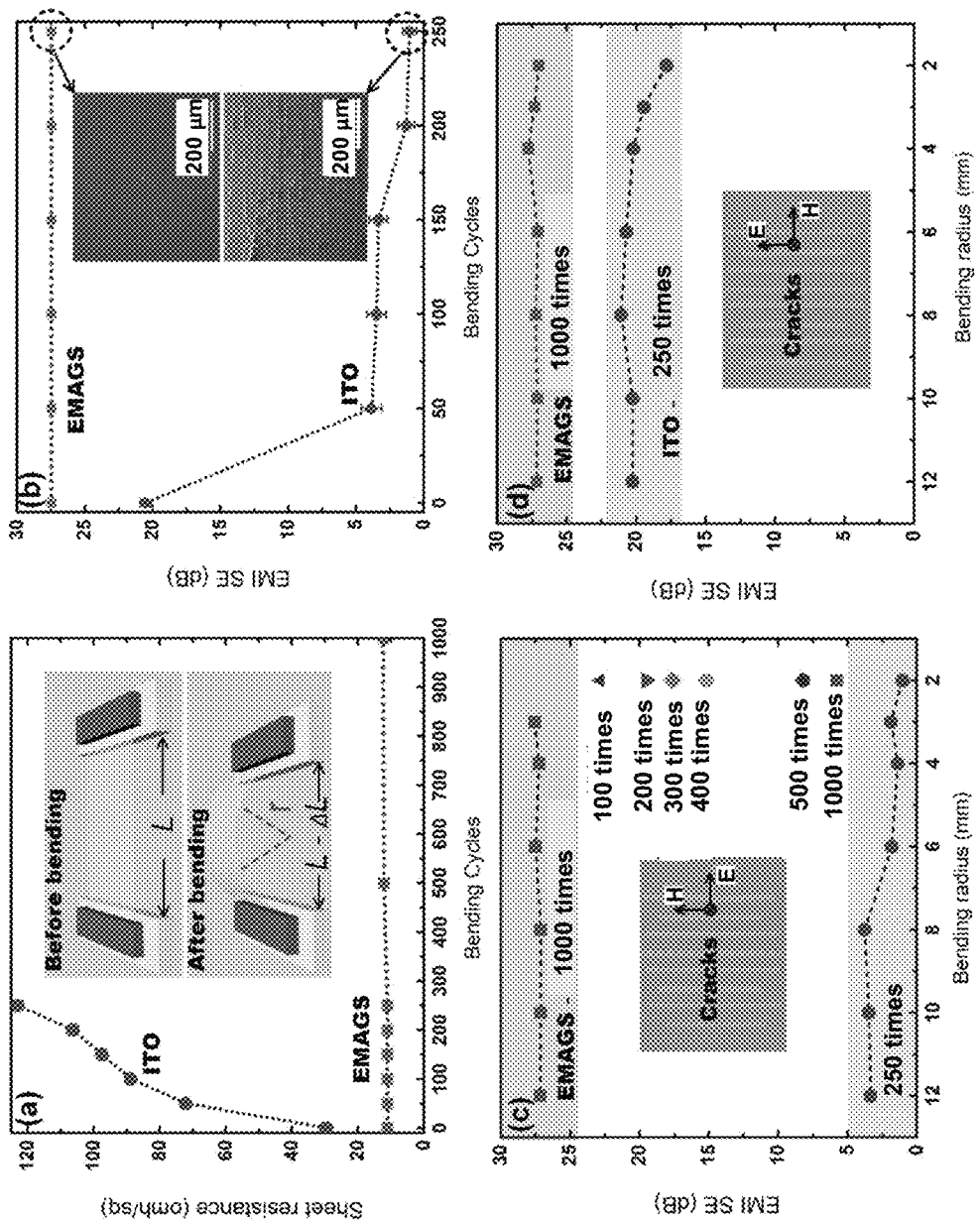

FIGS. 10A-10D. FIG. 10A is a measured sheet resistance ($R_s$) of an electromagnetic interference shield EMAGS stack prepared in accordance with certain aspects of the present disclosure and ITO (40 nm) on PET substrate as a function of bending cycles at the bending radius of 6 mm. The inset is a schematic illustration of the bending system. FIG. 10B is a graph showing EMI SE at 12 GHz for an electromagnetic interference shield EMAGS stack and ITO film as a function of bending cycles at the same bending radius. Inset shows the SEM images of corresponding films after 250 times bending. The EMI SE at 12 GHz of electromagnetic interference shield EMAGS and ITO films as a function of bending radius for transverse magnetic (TM) waves (FIG. 10C) and transverse electric (TE) waves (FIG. 10D). Insets show the orientations of the electric and magnetic fields of two polarizations with respect to crack lines.

Figures 11A, 11B:
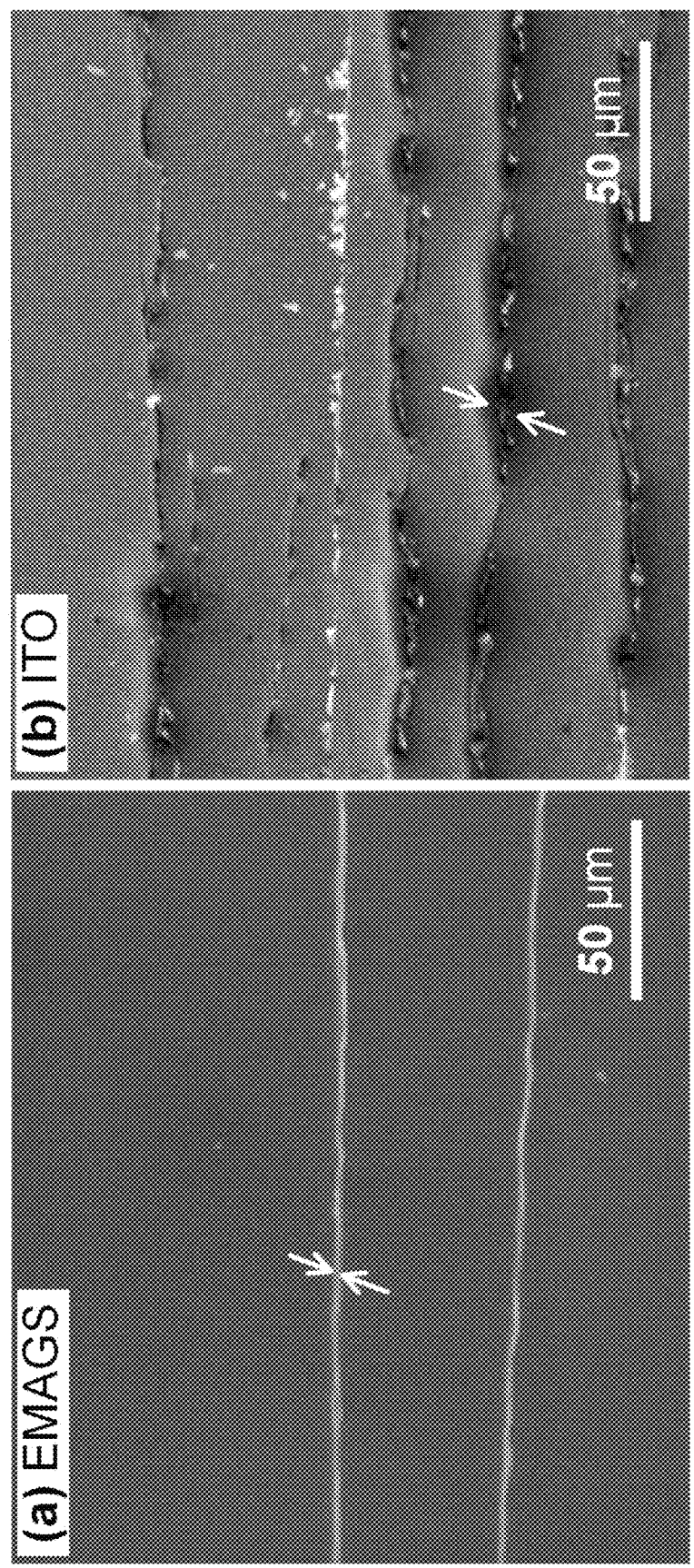

FIGS. 11A-11B are scanning electron microscopy (SEM) images showing cracks of an electromagnetic interference shield stack film prepared in accordance with certain aspects of the present disclosure (EMAGS film) (FIG. 11A) and ITO (thickness of 40 nm) film (FIG. 11B) after 250 bending cycles at the bending radius of 3 mm. White arrows in FIGS. 11A and 11B indicate the crack lines on the films.

Figure 12:
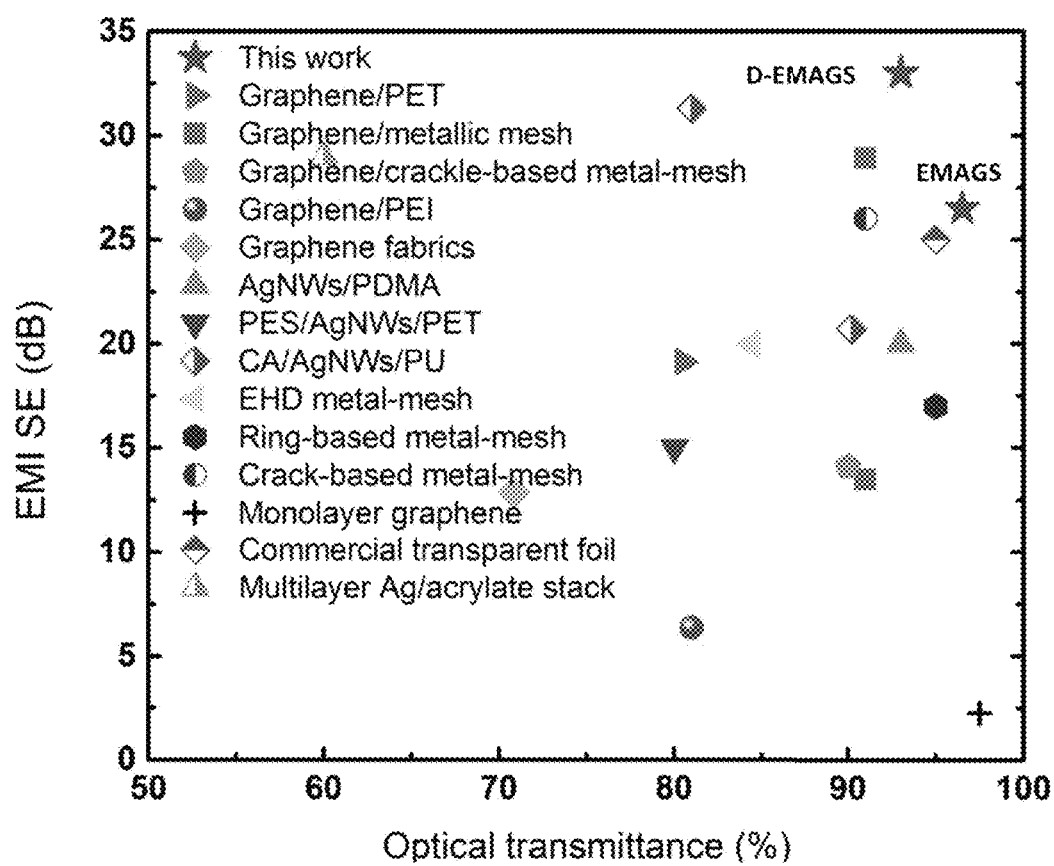

FIG. 12 shows a comparison of an electromagnetic interference (EMI) average shielding effectiveness (SE) and average optical transmittance in a visible light range for an electromagnetic interference shield single-stack design (EMAGS) electromagnetic interference shield double-stack design (D-EMAGS) compared to performance of previously reported transparent shielding materials.

Figures 13A, 13B, 13C, 13D, 13E:
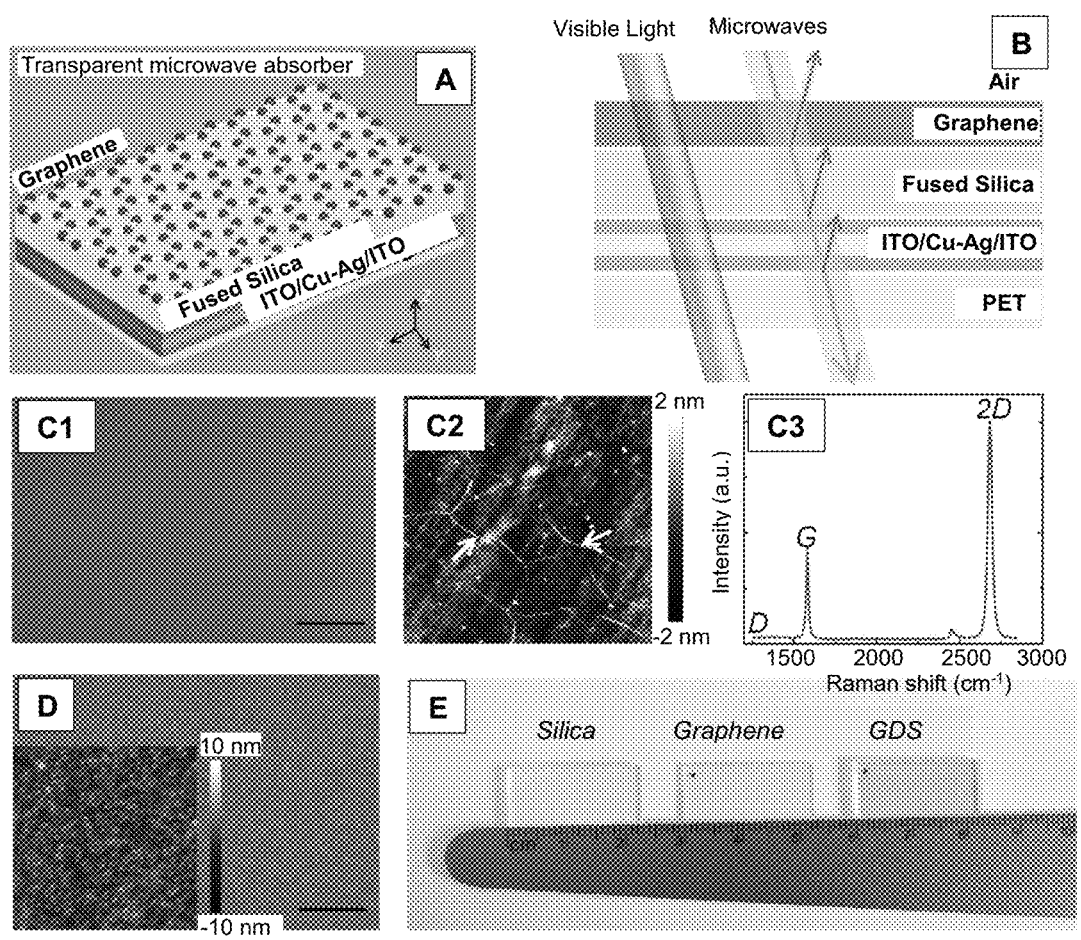

FIGS. 13A-13E. FIG. 13A shows a schematic of the transparent electromagnetic interference (EMI) shielding device used as a microwave absorber (MA). FIG. 13B shows a conceptual diagram illustrating multiple reflection of incident microwaves. FIGS. 13C(1)-13C(3) show SEM (FIG. 13C(1)) and AFM (FIG. 13C(2)) images of CVD-grown graphene on silica substrate. FIG. 13C(3) shows Raman spectra of the graphene on silica substrate (532 nm laser wavelength). FIG. 13D shows SEM and AFM images of ITO/Cu-doped Ag/ITO on a PET substrate. FIG. 13E shows photographs of centimeter-scale silica, graphene on silica substrate and transparent electromagnetic interference (EMI) shielding stack formed in accordance with certain aspect of the present disclosure, all of which show good transparency. Scale bars in the figures are all 1 μm.

Figure 14:
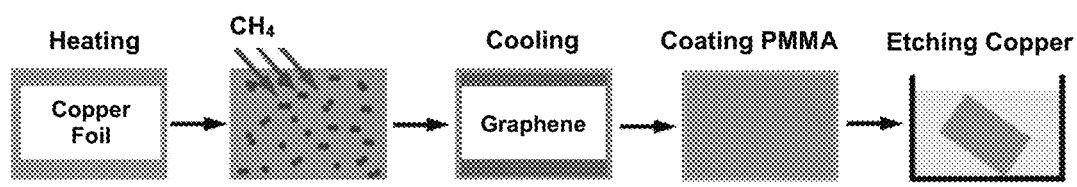

FIG. 14 shows a flow chart for a process of synthesis and transfer of graphene films.

Figures 15A, 15B, 15C, 15D:
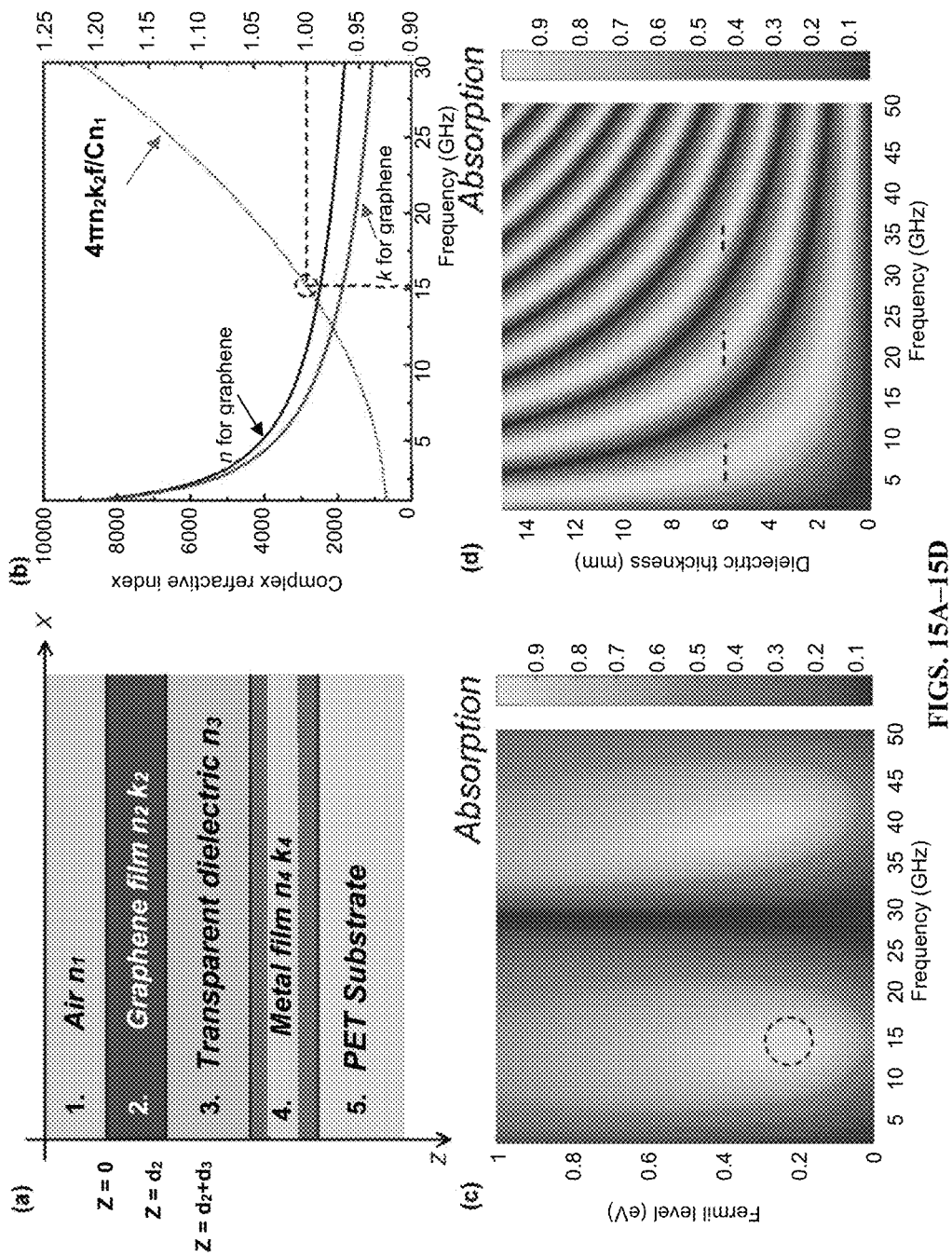

FIGS. 15A-15D. FIG. 15A shows a schematic of a calculation model of a transparent electromagnetic interference (EMI) microwave absorber comprising graphene, a transparent dielectric spacing layer, and a metal film on a PET substrate. FIG. 15B shows a complex refractive index (n and k) of graphene in the microwave region and calculated perfect absorption point using Equation 4. Calculated microwave absorption spectra as a function of Fermi level of graphene (FIG. 15C) and transparent dielectric thickness (FIG. 15D) from 1 to 30 GHz.

Figures 16A, 16B, 16C, 16D, 16E, 16F:
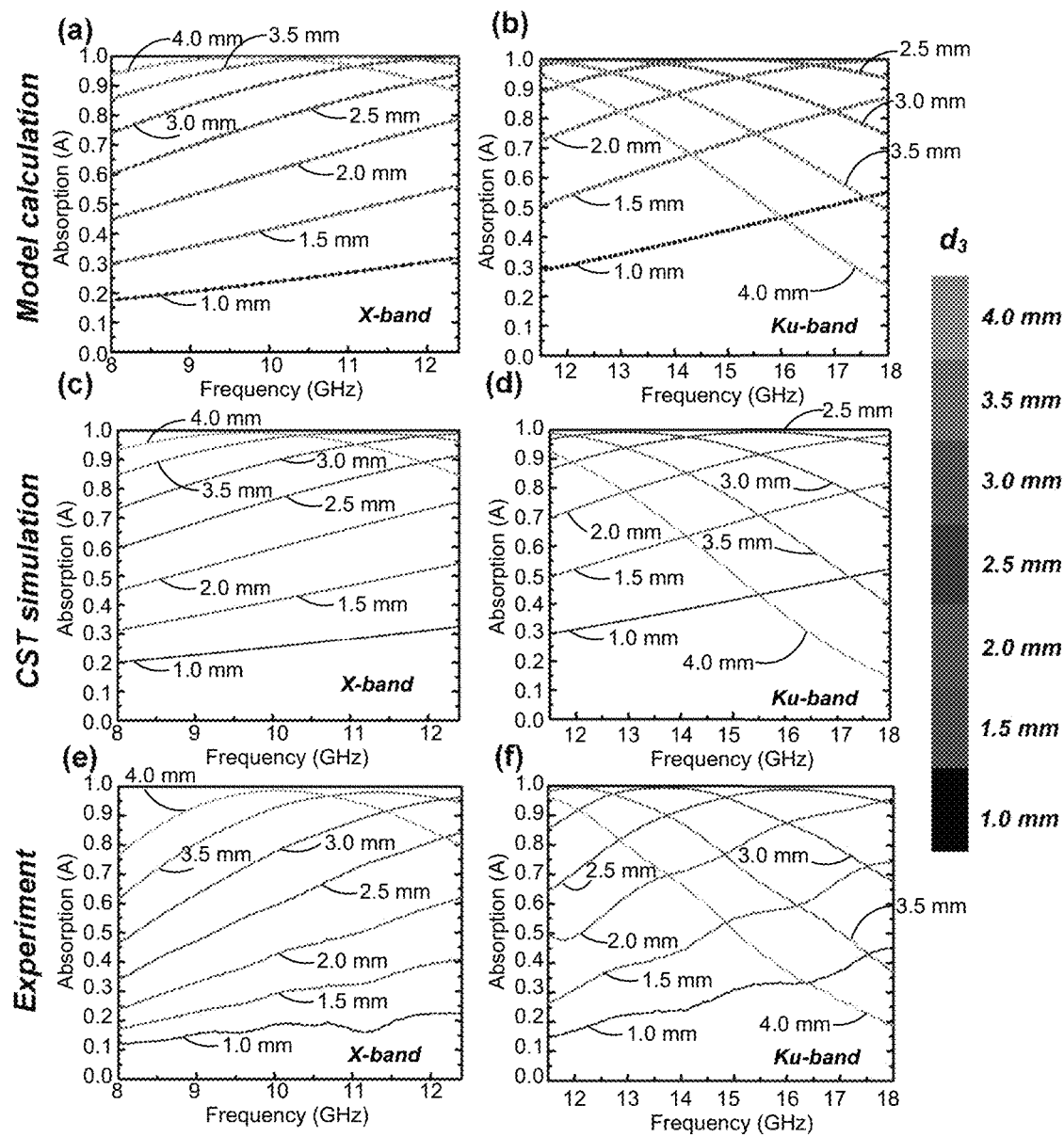

FIGS. 16A-16F. FIGS. 16A-16F show microwave absorption spectra for electromagnetic interference shield GDS cavities prepared in accordance with certain aspects of the present disclosure as a function of the silica thickness in the X and $K_u$ bands. FIGS. 16A-16B show model calculation using TMM ($\mu_c$=0.3 eV, Γ=20 ps). FIGS. 16C-16D show CST simulation ($\mu_c$=0.3 eV, Γ=20 ps). FIGS. 16E-16F show experimental results.

Figures 17A, 17B:
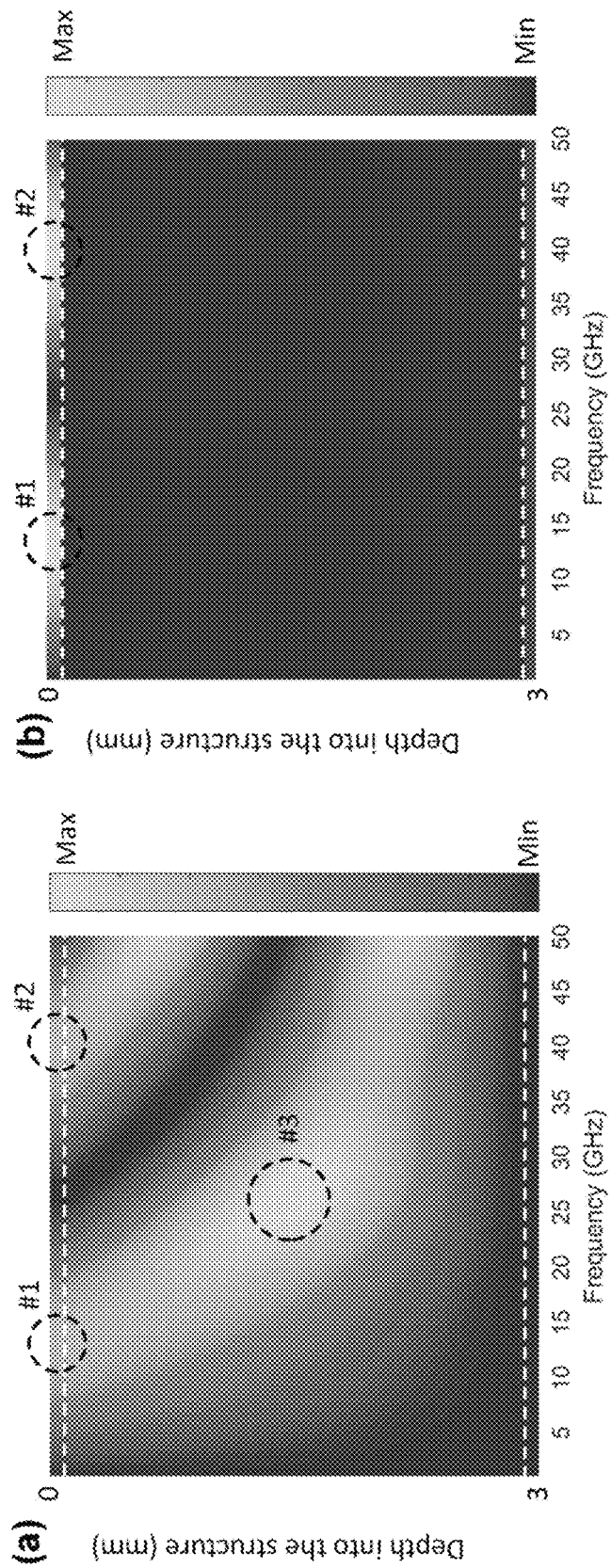

FIGS. 17A-17B. FIG. 17A is a calculated electric field distribution and FIG. 17B is a calculated absorbed power distribution within the entire transparent electromagnetic interference (EMI) stack cavity (GDS cavity having a top graphene layer and bottom Ag layer separated by a silica layer) at predetermined frequencies.

Figures 18A, 18B:
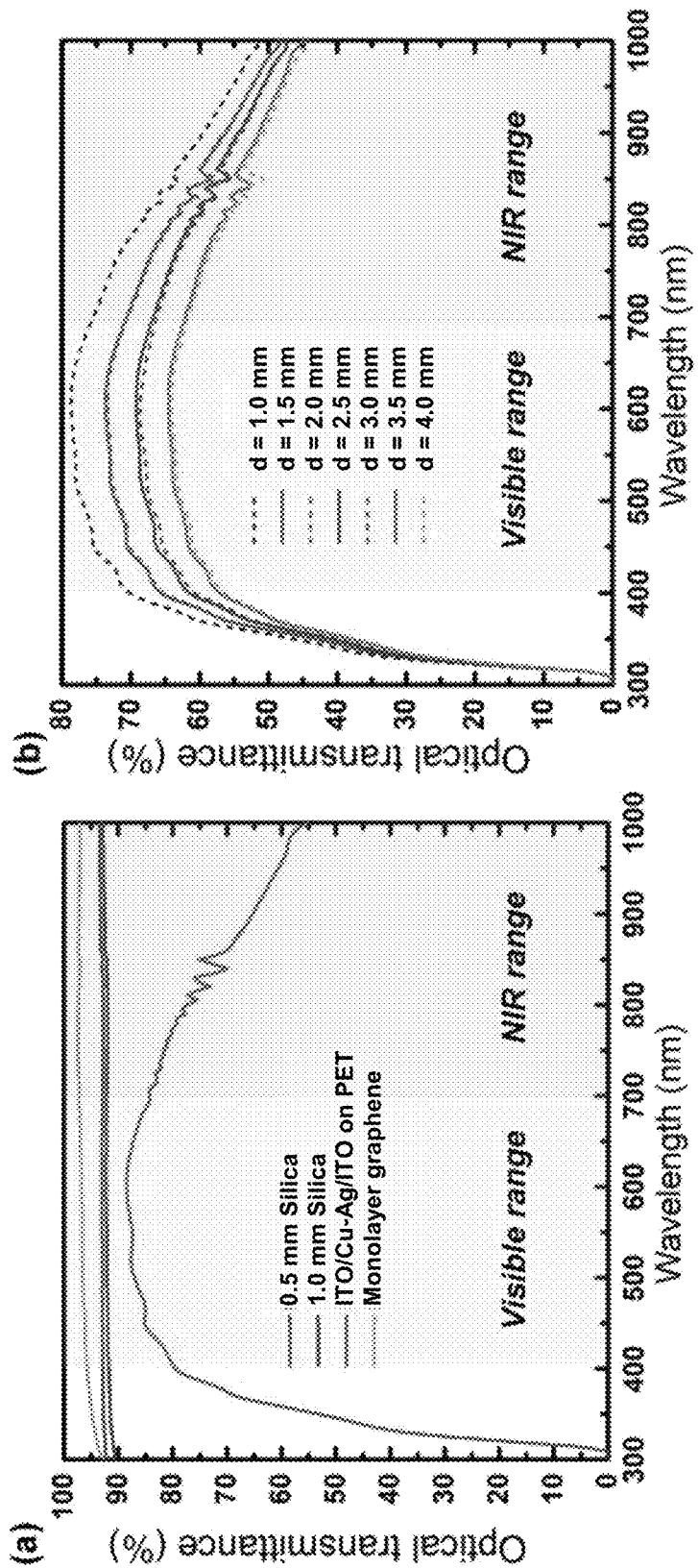

FIGS. 18A-18B. FIG. 18A shows optical transmittance spectra for 0.5 mm and 1 mm silica layers, ITO/CU-Ag/ITO on PET substrate and monolayer graphene. FIG. 18B shows optical transmittance spectra for transparent electromagnetic interference (EMI) GDS resonator cavities formed in accordance with certain aspect of the present disclosure with different silica thicknesses.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

As used herein, the terms "composition" and "material" are used interchangeably to refer broadly to a substance containing at least the preferred chemical compound(s), but which may also comprise additional substances or compounds, including impurities.

The disclosure of all patents, patent applications, articles, and literature referenced or cited in this disclosure are hereby incorporated by reference herein.

Example embodiments will now be described more fully with reference to the accompanying drawings.

In various aspects, the present disclosure provides methods for broadband electromagnetic interference (EMI)

shielding. The method may include disposing an electromagnetic shield according to various aspects of the present disclosure in a transmission path of electromagnetic radiation. In certain aspects, the methods provide broadband blocking or attenuation of the electromagnetic radiation in the microwave range. For example, the methods may block electromagnetic radiation having a frequency of greater than or equal to about 600 MHz to less than or equal to about 90 GHz. For example, the methods may block electromagnetic radiation in the microwave range, for example, having a frequency of greater than or equal to about 8 GHz to less than or equal to about 40 GHz. Electromagnetic radiation with such frequency may have a first range of wavelengths of greater than or equal to about 7.5 mm (40 GHz) to less than or equal to about 3.75 cm (8 GHz). Such electromagnetic radiation includes frequencies in the microwave range radio bands, including the entire X band (frequencies of about 7 to about 12 GHz), $K_u$ band (frequencies of about 12 to about 18 GHz), $K_a$ band (frequencies of about 26.5 to about 40 GHz), and K band (frequencies of about 18 to about 27 GHz) as designated by IEEE. As will be described further below, the electromagnetic shields prepared in accordance with certain aspects of the present disclosure block or attenuate electromagnetic radiation having such frequencies/the first range of wavelengths to an average shielding efficiency or shielding effectiveness (SE) of greater than or equal to 20 dB. The shielding effectiveness of a material is defined as the logarithmic ratio of incident power to that of the transmitted power and is normally expressed in decibel unit.

Furthermore, a passband of the electromagnetic interference shield corresponds to a second range of wavelengths in a visible light range, which are concurrently transmitted through the electromagnetic shield while the first range of wavelengths are blocked or attenuated from passing. Generally, visible light has a range of wavelengths of greater than or equal to about 390 nm to less than or equal to about 740 nm. As will be appreciated by those of skill in the art, the amount of blocking of electromagnetic radiation in the microwave range is inversely related to the transparency of the material within the visible light range. Thus, where there is a high transmissivity of visible light, the amount of blocking of the electromagnetic radiation in the microwave range will be comparatively less. Conversely, where there is a relatively high amount of blocking of microwave radiation, the visible light transmission levels will be relatively low. In certain variations, as will be described further below, an average transmission efficiency may be greater than or equal to about 65% of visible light having the second range of wavelengths through the electromagnetic shield when the average shielding efficiency for microwave radiation from greater than or equal to about 600 MHz to less than or equal to about 90 GHz is greater than or equal to 20 dB. In certain other variations, an average transmission efficiency may be greater than or equal to about 70% of visible light having the second range of wavelengths through the electromagnetic shield when the average shielding efficiency for microwave radiation from greater than or equal to about 600 MHz to less than or equal to about 90 GHz is greater than or equal to 20 dB, optionally greater than or equal to about 75%, optionally greater than or equal to about 80%, and in certain aspects, optionally greater than or equal to about 85% when the average shielding efficiency for microwave radiation from greater than or equal to about 600 MHz to less than or equal to about 90 GHz is greater than or equal to 20 dB. In certain variations, average shielding efficiency for microwave radiation is greater than or equal to 30 dB while the average visible transmission efficiency for visible light is greater than or equal to about 80%, optionally the average shielding efficiency is greater than or equal to 50 dB while the average visible transmission efficiency is greater than or equal to about 65%. In one variation, as will be described further below, an average transmission efficiency may be greater than or equal to about 85% of visible light having the second range of wavelengths through the electromagnetic shield when the average shielding efficiency for microwave radiation from greater than or equal to about 600 MHz to less than or equal to about 90 GHz is greater than or equal to 20 dB. In another variation, as will be described further below, an average transmission efficiency may be greater than or equal to about 85% of visible light having the second range of wavelengths through the electromagnetic shield when the average shielding efficiency for microwave radiation from greater than or equal to about 8 GHz to less than or equal to about 40 GHz is greater than or equal to 26 dB.

Figure 1:
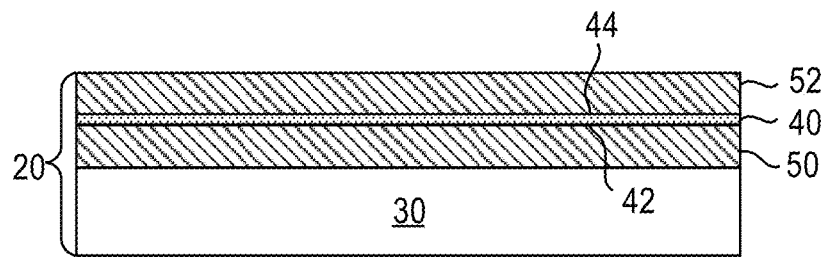
FIG. 1 shows a schematic of a transparent electromagnetic interference (EMI) shield device having a stack comprising an ultrathin electrically conductive silver alloy flanked by a first electrically conductive transparent antireflection layer and a second electrically conductive transparent antireflection layer in accordance with certain aspects of the present disclosure.

In various aspects, the electromagnetic shield is a stack 20, as that shown in FIG. 1. The stack 20 includes a substrate 30. The stack 20 includes an ultrathin metal layer 40 defining a first side 42 and a second side 44 opposite thereto. A first layer 50 is disposed on the first side 42 of the ultrathin metal layer 40. The first layer may be formed of an electrically conductive layer that is transparent to the desired range of wavelengths of electromagnetic radiation (e.g., visible light). The first layer 50 may be in direct contact with the first side 42 of the ultrathin metal layer 40. A second layer 52 is disposed on the second side 44 of the ultrathin metal layer 40. The second layer 52 may be formed of an electrically conductive layer that is transparent to the desired range of wavelengths of electromagnetic radiation (e.g., visible light). The second layer 52 may likewise be in direct contact with the second side 44 of the ultrathin metal layer 40. In certain variations, the first layer 50 has a thickness of less than or equal to about 45 nm and the second layer 52 has a thickness of less than or equal to about 45 nm. The first layer 50 may have a thickness of greater than or equal to about 3 nm to less than or equal to about 45 nm, optionally greater than or equal to about 35 nm to less than or equal to about 45 nm, and in certain variations, about 40 nm. Likewise, the second layer 52 may have a thickness of greater than or equal to about 3 nm to less than or equal to about 45 nm, optionally greater than or equal to about 35 nm to less than or equal to about 45 nm, and in certain variations, about 40 nm.

In certain aspects, the stacks provided by the present disclosure are flexible and are thus are capable of significant elongation, flexing, bending or other deformation along one or more axes. The term "flexible" can refer to the ability of a material, structure, or component to be deformed (for example, into a curved shape) without undergoing a permanent transformation that introduces significant strain, such as strain indicating a failure point of a material, structure, or component. Notably, it was surprisingly discovered that despite the inclusion of one or more layers of potentially brittle material in the shielding devices prepared in accordance with certain aspects of the present technology, such as indium tin oxide, as the first and second layers 50, 52, the stack with multiple materials still unexpectedly exhibits flexibility.

Any known substrate 30 that is highly transmissive to visible light can be selected by those of skill in the art. Suitable examples of substrates include a glass based or polymeric substrate. In certain aspects, the substrate can is flexible. For example, a suitable polymeric substrate optionally comprises polyesters, such as polyethylene terephthalate (PET), polyethylene naphthalate or (poly(ethylene 2,6-naphthalate) (PEN), polycarbonates, polyacrylates and polymethacrylates, including poly(methylmethacrylate) (PMMA), poly(methacrylate), poly(ethylacrylate), siloxanes, like polydimethylsiloxane (PDMS), and the like. In other variations, the substrate may comprise silicon dioxide, silicon, and the like, by way of non-limiting example.

The ultrathin metal layer 40 is a continuous film that comprises silver (Ag). Silver (Ag) is widely used due to its excellent electrical conductivity and low optical loss in the visible band; however, continuous thin silver films are difficult to obtain and mostly form discontinuous films during or after the deposition. The continuous metal film may also comprise another conductive metal, such as copper (Cu), which helps to form a continuous and smooth silver alloy layer. The ultrathin metal layer 40 is desirably smooth and continuous, exhibiting low optical loss and low electrical resistance, while having high temperature stability. Such films can be made easily without the application of any seeding layer or need for specific limited fabrication conditions.

In certain aspects, the ultrathin metal layer 40 in accordance with certain aspects of the present disclosure provides an electrically conductive thin film comprising silver (Ag) at greater than or equal to about 80 atomic % of the total film composition. The thin film composition further comprises a conductive metal, distinct from silver (Ag). In certain variations, the distinct electrically conductive metal may comprise copper (Cu). In alternative variations, the conductive metal may be selected from the group consisting of: aluminum (Al), gold (Au), Platinum (Pt), Palladium (Pd), titanium (Ti), nickel (Ni), chromium (Cr), gold (Au), magnesium (Mg), tantalum (Ta), germanium (Ge), or combinations thereof.

In certain variations, the electrically conductive ultrathin metal layer 40 may comprise silver at greater than or equal to about 80 atomic % of the total composition of the ultrathin metal layer 40, while the conductive metal, e.g., copper, may be present at greater than 0 atomic % to less than or equal to about 20 atomic % of the total film composition. In certain variations, silver may be present at greater than or equal to about 90 atomic % and the conductive metal, e.g., copper, may be present at greater than 0 atomic % to less than or equal to about 10 atomic % of the total film composition.

In certain variations, the conductive metal (e.g., copper) is optionally present at greater than or equal to about 1 atomic % to less than or equal to about 20 atomic % of the total film composition, and optionally at greater than or equal to about 1 atomic % to less than or equal to about 10 atomic %. The silver may be present at greater than or equal to about 80 atomic % to less than or equal to about 99 atomic % of the total film composition. In certain variations, the conductive metal (e.g., copper) is optionally present at greater than or equal to about 1 atomic % to less than or equal to about 15 atomic % of the total film composition, while the silver may be present at greater than or equal to about 85 atomic % to less than or equal to about 99 atomic % of the total film composition. In other variations, the conductive metal (e.g., copper) is optionally present at greater than or equal to about 2 atomic % and less than or equal to about 10 atomic % of the total film composition, while the silver may be present at greater than or equal to about 90 atomic % to less than or equal to about 98 atomic % of the total film composition. Such ultrathin metal layers 40 may be prepared by the techniques as described in U.S. Patent Publication No. 2017/0200526 to Guo et al. entitled "Ultra-thin Doped Noble Metal Films for Optoelectronics and Photonics Applications," the relevant portions of which are hereby incorporated by reference.

As discussed in U.S. Patent Publication No. 2017/0200526, the minor amounts of a conductive metal, such as aluminum, results in doped Ag films that are smooth and have a sub-nanometer RMS roughness. While U.S. Patent Publication No. 2017/0200526 describes use of aluminum or other conductive metals, copper doping of silver appears to similarly provide smooth surfaces with diminished roughness. The ultrasmooth surface morphology of doped Ag films is very stable at both room temperature and elevated temperature. However, inclusion of large amounts of the conductive metal (e.g., copper) in excess of 20 atomic % may detrimentally diminish optical loss, electrical conductivity, and/or transparency of the silver-based film. Copper-doped silver films prepared in accordance with certain aspects of the present disclosure provide highly conductive ultrathin layers, even as compared to other doped-silver films, like aluminum-doped films.

In certain aspects, an "ultra-thin" layer or film may have a thickness of less than or equal to about 25 nm. In certain variations, the ultrathin metal layer has a thickness of greater than or equal to about 2 nm and less than or equal to about 20 nm; optionally greater than or equal to about 3 nm to less than or equal to about 20 nm, optionally greater than or equal to about 3 nm to less than or equal to about 15 nm, optionally greater than or equal to about 3 nm to less than or equal to about 10 nm, and optionally greater than or equal to about 5 nm to less than or equal to about 10 nm.

Furthermore, in various aspects, the thin films comprising Ag and the conductive metal (e.g., copper) have a smooth surface. By a "smooth" surface, it is meant that a root mean squared (RMS) of measured surface roughness (e.g., from peaks to valleys) is less than or equal to about 25% of the total film thickness, optionally less than or equal to about 20% of the total film thickness, optionally less than or equal to about 15% of the total film thickness, optionally less than or equal to about 14% of the total film thickness, optionally less than or equal to about 13% of the total film thickness, optionally less than or equal to about 12% of the total film thickness, optionally less than or equal to about 11% of the total film thickness, optionally less than or equal to about 10% of the total film thickness, optionally less than or equal to about 9% of the total film thickness, optionally less than or equal to about 8% of the total film thickness, optionally less than or equal to about 7% of the total film thickness, optionally less than or equal to about 6% of the total film thickness, and in certain variations, optionally less than or equal to about 5% of the total film thickness.

As appreciated by those of skill in the art, ascertaining smoothness of a film is relative and depends on an overall thickness of the film, where greater amounts of root mean squared (RMS) surface roughness can still considered to be smooth if a film is thicker. In certain variations, a smooth surface of the film comprising silver and the conductive metal (e.g., copper) has a surface roughness of less than or equal to about 1 nm root mean squared (RMS), where an overall thickness of the film is at least about 10 nm. In other variations, a smooth surface has a surface roughness of less than or equal to about 0.5 nm root mean squared (RMS), where an overall thickness of the film is at least about 10 nm.

The electrically conductive thin films of the present disclosure that comprise Ag and a second electrically conductive metal, like Cu, may have a sheet resistance ($R_s$) of less than or equal to about 25 Ohm/square, optionally less than or equal to about 20 Ohm/square, optionally less than or equal to about 15 Ohm/square, optionally less than or equal to about 13 Ohm/square, optionally less than or equal to about 10 Ohm/square, optionally less than or equal to about 5 Ohm/square, optionally less than or equal to about 4 Ohm/square, optionally less than or equal to about 3 Ohm/square, optionally less than or equal to about 2 Ohm/square, and optionally less than or equal to about 1 Ohm/square.

As noted above, the electrically conductive ultrathin metal layers of the present disclosure are capable of transmitting select portions of the electromagnetic spectrum, such as visible light, and thus considered to be transparent or semi-transparent. Transparency may generally encompass semi-transparency, and can be understood generally to mean that greater than or equal to about 50% of a predetermined target wavelength or range of wavelengths (which may be polarized or non-polarized) of light/energy pass through the electrically conductive ultrathin metal layer. In certain variations, greater than or equal to about 60% of a target range of wavelengths passes through the thin film, optionally greater than or equal to about 65%, optionally greater than or equal to about 70%, optionally greater than or equal to about 75%, optionally greater than or equal to about 80%, optionally greater than or equal to about 85%, optionally greater than or equal to about 90%, optionally greater than or equal to about 95%, and in certain variations, optionally greater than or equal to about 97% of target range of wavelength(s) passes through the electrically conductive ultrathin metal layer. For certain applications, such as displays on the cellphones and mobile devices, vehicle windshields, and advanced optical components in aerospace instruments, typically optical transmittance levels of over 80%, or even over 90% are required.

In certain aspects, the electrically conductive ultrathin metal layers may reflect certain select portions of the electromagnetic spectrum and thus are reflective or semi-reflective. Reflectivity may generally encompass semi-reflectivity, and can be understood generally to mean that greater than or equal to about 50% of a predetermined target wavelength or range of wavelengths (which may be polarized or non-polarized) of light/energy are reflected from a surface and therefore do not pass through the electrically conductive ultrathin metal layer. In certain variations, greater than or equal to about 60% of a target wavelength (or range of wavelengths) reflected from the ultrathin metal layer, optionally greater than or equal to about 70%, optionally greater than or equal to about 75%, optionally greater than or equal to about 80%, optionally greater than or equal to about 85%, optionally greater than or equal to about 90%, optionally greater than or equal to about 95%, and in certain variations, optionally greater than or equal to about 97% of target wavelength(s) is reflected by the electrically conductive ultrathin metal layers of the present disclosure.

In certain variations, the electrically conductive ultrathin metal layers are transparent to electromagnetic waves in the visible light range, while being reflective to electromagnetic waves in the microwave radiation ranges. By transparent, it is meant that the electrically conductive ultrathin metal layer is transmissive for a target range of wavelengths of electromagnetic energy, for example, in the visible wavelength ranges. By reflective, it is meant that the electrically conductive ultrathin metal layer reflects a significant portion of a predetermined range of wavelengths of electromagnetic energy, for example, in the microwave range.

The electrically conductive ultrathin metal layers comprising silver and an electrically conductive metal, like copper, may be flexible (e.g., capable of bending without mechanical failure). As noted above, flexible materials can be bent, flexed or deformed along one or more axe without undergoing a permanent transformation that introduces significant strain, such as strain indicating a failure point of a material, structure, or component. Further, the electromagnetic interference (EMI) shields of the present disclosure can exhibit an electrical conductivity expressed by a sheet resistance ($R_s$) of less than or equal to 20 Ohm/square after greater than or equal to about 100 cycles of bending, optionally after greater than or equal to about 250 cycles of bending, optionally after greater than or equal to about 500 cycles of bending, optionally after greater than or equal to about 1,000 cycles of bending, optionally after greater than or equal to about 2,500 cycles of bending, optionally after greater than or equal to about 5,000 cycles of bending, and in certain variations, optionally after greater than or equal to about 10,000 cycles of bending. In certain variations, the sheet resistance ($R_s$) is less than or equal to 15 Ohm/square after greater than or equal to about 100 cycles of bending, optionally after greater than or equal to about 250 cycles of bending, optionally after greater than or equal to about 500 cycles of bending, optionally after greater than or equal to about 1,000 cycles of bending, optionally after greater than or equal to about 2,500 cycles of bending, optionally after greater than or equal to about 5,000 cycles of bending, and in certain variations, optionally after greater than or equal to about 10,000 cycles of bending. In other variations, the sheet resistance ($R_s$) is less than or equal to 10 Ohm/square after greater than or equal to about 100 cycles of bending, optionally after greater than or equal to about 250 cycles of bending, optionally after greater than or equal to about 500 cycles of bending, optionally after greater than or equal to about 1,000 cycles of bending, optionally after greater than or equal to about 2,500 cycles of bending, optionally after greater than or equal to about 5,000 cycles of bending, and in certain variations, optionally after greater than or equal to about 10,000 cycles of bending of the electromagnetic interference (EMI) shield.

In various aspects, the present disclosure provides methods for broadband electromagnetic interference (EMI) shielding. The method may include disposing an electromagnetic shield in a transmission path of a beam of electromagnetic radiation. In this manner, the electromagnetic shield blocks a range of frequencies of greater than or equal to about 8 GHz to less than or equal to about 40 GHz to a shielding efficiency of greater than or equal to 26 dB. Further, the electromagnetic shield transmits a second range of wavelengths in a visible range of greater than or equal to about 390 nm to less than or equal to about 740 nm to an average transmission efficiency of greater than or equal to about 85% through the electromagnetic shield.

As discussed above, the electromagnetic shield may be a flexible stack comprising a plurality of layers. In certain variations, the electromagnetic shield comprises a continuous electrically conductive metal film or layer defining a first side and a second opposite side and comprising silver (Ag) at greater than or equal to about 80 atomic % and copper (Cu) at less than or equal to about 20 atomic %. In certain variations, the continuous metal film is an ultrathin metal layer having any of the thicknesses specified above, for example, less than or equal to about 10 nm. In certain other variations, the continuous ultrathin metal layer has a thickness of less than or equal to about 8 nm. The continuous ultrathin metal layer is further electrically conductive and may have a sheet resistance of less than or equal to about 20 Ohm/square or any of the values specified above.

By employing an ultrathin metal layer in a stack with adjacent conductive dielectric antireflection material layers, optical transmittance can be enhanced without increasing the metal layer thickness. As such, the stack may include a first layer 50 disposed on the first side 42 of the continuous ultrathin metal film. The first layer 50 may be formed of a material that is transparent to the desired range of wavelengths of electromagnetic radiation (e.g., visible light). Such a first layer 50 may serve as an optical antireflection layer. Further, the first layer 50 may be formed of a material that is electrically conductive and may be a dielectric material. In certain aspects, the first layer 50 comprises a transparent conductive oxide, for example, a material selected from the group consisting of: indium tin oxide (ITO), doped zinc oxides, such as aluminum zinc oxide (AZO), indium zinc oxide (IZO), doped tin oxides, such as fluorine-doped tin oxide (FTO), and mixtures thereof. In other aspects, the first layer 50 comprises a conductive dielectric polymeric material, such as poly(3,4-ethylenedioxythiophene) (PEDOT) that may be combined with poly(styrenesulfonate). In select variations, the first layer 50 comprises a conductive material selected from the group consisting of: indium tin oxide, aluminum zinc oxide (AZO), indium zinc oxide (IZO), fluorine-doped tin oxide (FTO), poly(3,4-ethylenedioxythiophene) (PEDOT), and mixtures thereof. In further select variations, the first layer 50 comprises indium tin oxide (ITO). With respect to indium-doped tin oxide, as compared to other conductive dielectric materials, like aluminum-doped zinc oxide, indium-doped zinc oxide, and poly(3,4-ethylenedioxythiophene):poly(styrenesulfonate), ITO provides high conductivity, while having a particularly desirable refractive index for Cu-doped Ag film in a desired optical regime.

Further, a second layer 52 is disposed on the second side 44 of the continuous ultrathin metal film 40. The second layer 52 may be formed of the same materials suitable for use in the first layer 50, for example, it may be formed of a material that is a dielectric material transparent to the desired range of wavelengths of electromagnetic radiation (e.g., visible light), which may likewise serve as an optical antireflection layer that may also be electrically conductive. The first layer 50 and second layer 52 may have the same composition or distinct compositions from one another. The second layer 52 optionally comprises a transparent conductive oxide, for example, a material selected from the group consisting of: indium tin oxide (ITO), doped zinc oxides, such as aluminum zinc oxide (AZO), indium zinc oxide (IZO), doped tin oxides, such as fluorine-doped tin oxide (FTO), and mixtures thereof. In other aspects, the second layer 52 comprises a conductive dielectric polymeric material, such as poly(3,4-ethylenedioxythiophene) (PEDOT) that may be combined with poly(styrenesulfonate). In select variations, the second layer 52 comprises a conductive material selected from the group consisting of: indium tin oxide, aluminum zinc oxide (AZO), indium zinc oxide (IZO), fluorine-doped tin oxide (FTO), poly(3,4-ethylenedioxythiophene) (PEDOT), and mixtures thereof. In further select variations, the second layer 52 comprises indium tin oxide (ITO).

In certain variations, the flexible stack further comprises at least one second electrically conductive lossy graphene layer, so that the electromagnetic inference shield device is based on an asymmetric Fabry-Pérot resonator cavity. A Fabry-Pérot resonator cavity or etalon is an interference filter, whose operation is generally described in U.S. Pat. No. 9,261,753 to Guo et al, entitled "Spectrum Filtering for Visual Displays and Imaging Having Minimal Angle Dependence," the relevant portions of which are herein incorporated by reference.

The general operational principles of an electromagnetic interference shield 100 based on a Fabry-Pérot filter prepared in accordance with certain aspects of the present disclosure are shown in FIG. 2. A source of electromagnetic radiation is directed towards the shield 100, such that the shield is placed in a transmission path of the electromagnetic radiation. More specifically, an electromagnetic wave 110 having a visible light component (having wavelengths within a first range corresponding to the visible light range) and a second component (having wavelengths/frequencies corresponding to the microwave range) approaches the shield 100.

The shield 100 includes the components of a stack assembly 120 having a plurality of layers. As can be seen in FIG. 2, stack assembly 120 includes components like stack 20 shown in FIG. 1. To the extent that components are shared between stack assembly 120 and stack 20, a discussion of these components and their properties will not be repeated herein for brevity. Adjacent to the second layer 52 is a spacing layer 122, which may comprise a dielectric material, such as fused silica or an insulating polymer layer. In certain aspects, a dielectric material has a relatively high refractive index preferably greater than about 1.5, optionally greater than or equal to 2, optionally greater than or equal to about 3, and in certain variations, greater than or equal to about 4. In certain aspects, the spacing layer 122 may be a quarter-wave thickness ($\lambda/4$) of the peak wavelength of the second range to be reflected or absorbed, for example from mm to cm range. The spacer can be inorganic dielectric, organic dielectric, or a composite material made of both. In certain variations, suitable transparent organic materials optionally include such as polyethylene terephthalate (PET), polyethylene naphthalate or (poly(ethylene 2,6-naphthalate) (PEN), polycarbonates, polyacrylates and polymethacrylates, including poly(methylmethacrylate) (PMMA), poly(methacrylate), poly(ethylacrylate), siloxanes, like polydimethylsiloxane (PDMS), and the like. It can be lossless or have a certain amount of absorption in the microwave range. A peak absorption frequency of the stack assembly 120 that operates as a resonator cavity can be tuned by changing the thickness of the dielectric spacer, by way of example. In certain aspects, a thickness of the spacer or spacing layer 122 can be greater than or equal to about 1 mm to less than or equal to about 10 mm.

The stack assembly 120 further comprises an electrically conductive lossy layer 124 that comprises a material such as graphene. Graphene includes carbon atoms having a honeycomb-like lattice organization. In certain variations, the electrically conductive lossy layer 124 may be a monolayer of graphene, which may have a thickness of about 0.35 nm, or it can be bi-layer, or have multiple layers of graphene. Overall conductance of the electrically conductive lossy layer 124 can increase with a greater number of layers, which improves the microwave shielding, but there will be some tradeoff with the visible range transmission. It should be noted that the electromagnetic interference (EMI) shield assemblies having a resonator cavity in accordance with certain variations of the present disclosure are distinctive from a conventional Fabry-Pérot cavity. Traditional Fabry-Pérot resonators exhibit highly frequency selective feature (high Q) in their reflection or transmission spectra, and in that case the transmission process does not involve any energy conversion or absorption. In contrast, certain variations of electromagnetic interference (EMI) shielding devices that incorporate a lossy graphene layer in the Fabry-Pérot cavity provide substantial power absorption.

The graphene may comprise at least one dopant that are known in the art. The presence of one or more dopants can serve to modulate the peak resonance of the resonator cavity. By way of example, typical chemicals used for graphene doping may be either n-type dopants or p-type dopants. Non-limiting examples of n-type graphene dopants include ethanol and/or ammonia, while a p-type dopant may be $NO_2$ gas.

While not shown, the stack assembly may include multiple electrically conductive lossy layers that comprise a material such as graphene, in addition to the electrically conductive lossy layer 124. Such additional lossy layers may be strategically distanced away from the stack 20 to expand the broadband absorption of energy through a wider range of wavelengths. For example, a first electrically conductive lossy layer may be spaced apart from the stack 20 by a first spacing layer having a thickness corresponding to a first distance of a quarter-wavelength for a first target wavelength of energy, while a second electrically conductive lossy layer may be spaced apart from the stack 20 by a second distance of a quarter-wavelength for a second target wavelength of energy. Multiple electrically conductive lossy layers can be incorporated into the stack assembly 120 to target multiple target wavelengths and thus enhance and broaden the range of energy absorption.

In this manner, the stack assembly 120 defines an asymmetric resonator cavity, where the ultrathin metal layer 40 flanked by the first and second layers 50, 52 and the second electrically conductive layer 124 create parallel reflective surfaces to the second component (having wavelengths/frequencies corresponding to the microwave range). Such a shield 100 has an asymmetric architecture, where the reflective second electrically conductive layer 124 that interfaces with air 132 has much higher transmission than the reflective bottom stack comprising the ultrathin metal layer 40 and the first and second layers 50, 52. Notably, the ultrathin metal layer 40 functions as a reflector within the shield 100.

A portion of electromagnetic energy corresponding to the first component enters stack assembly 120 resonates between the pair of parallel reflective surfaces (like a Fabry-Pérot based etalon interference filter). The first component/portion of the electromagnetic energy (e.g., visible light) is transmitted through the second electrically conductive layer 124 and then through the stack 20 to generate a filtered output 130 having a predetermined range of wavelengths that exits the filter assembly 30. The second component/portion of the electromagnetic energy is reflected at various points within the stack assembly 120, so that it reflects at the second electrically conductive layer 124, at the second layer 52, or at the first layer 50 to generate a reflected output 134 having a predetermined range of wavelengths. In certain aspects, the second electrically conductive layer 124 formed of graphene may absorb the reflected output 134. As such, where a graphene layer is present, the blocking by the shield 100 may comprise absorbing the second range of wavelengths within the resonator cavity, so that a reflectivity of the electromagnetic shield is less than or equal to about 5%, optionally less than or equal to about 1%, and in certain variations, optionally less than or equal to about 0.1%.

In embodiments like electromagnetic shield 100, the absorption of the second component of electromagnetic radiation is enhanced as compared to the embodiment shown in FIG. 1, for example, at a range of frequencies of 600 MHz to less than or equal to about 90 GHz, or alternatively greater than or equal to about 8 GHz to less than or equal to about 40 GHz. In certain variations, the average shielding efficiency for the second component (e.g., microwave radiation) is greater than or equal to 30 dB while the average transmission efficiency of the first component of the electromagnetic radiation (e.g., visible light) is greater than or equal to about 80%. In another variation, the average shielding efficiency of the second component (e.g., microwave radiation) is greater than or equal to 50 dB while the average transmission efficiency of the first component (e.g., visible light) is greater than or equal to about 65%. In comparison, most of the commercial products demonstrate shielding performance in the relatively low frequencies, typically below 3 GHz, which is far narrower and lower than the broadband shielding effectiveness provided by electromagnetic interference shields prepared in accordance with various aspects of the present technology.

In certain other variations, electrical gating can be used to shift a wavelength of peak resonance within a modified Fabry-Pérot resonator cavity, as desired. In FIG. 3, one such example of an electromagnetic interference shield 100' is shown. The electromagnetic interference shield 100' is similar to the electromagnetic interference shield 100 in FIG. 2, thus to the extent that they are not discussed again, the components or their function are the same as those described in the context of FIG. 2. A stack assembly 120' includes a spacing layer 122, which may comprise a dielectric material, such as fused silica, like that described above. The stack assembly 120' further comprises a second electrically conductive layer 124' that comprises a material such as graphene. A stack 20 includes an electrically conductive ultrathin metal layer 40 flanked by a first layer 50 and a second layer 52.

A peak absorption frequency of the stack assembly 120' that operates as a resonator cavity can be tuned by gating the second electrically conductive layer 124' to the electrically conductive ultrathin metal layer 40 via an electrical gating system 150. Thus, a first electrically conductive terminal 160 is in electrical communication with the second electrically conductive layer 124'. A second electrically conductive terminal 162 is in electrical communication with the electrically conductive ultrathin metal layer 40. The first electrically conductive terminal 160 and the second electrically conductive terminal 162 are connected to one another and a voltage source 164. Each of the first and second electrically conductive terminals 160, 162 may be formed of an electrically conductive material known in the art, such as copper, aluminum, silver, gold, and the like. In this manner, voltage can be applied and varied in the electrical gating system to vary the properties of graphene in the second electrically conductive layer 124' and thus to modulate and vary the wavelengths of reflected and/or absorbed electromagnetic radiation. The gating refers to field effect modulation of the electrical conductivity of a material like graphene by the application of an external electric field. The graphene layer's charge density, and hence conductivity can be tuned by applying different bias voltages between 160 and 162. Therefore, the corresponding permittivity of graphene can be tuned, resulting in the change of the microwave absorption of the graphene layer. As the internal loss in the cavity changes, the associated absorption peak position and intensity will shift accordingly.

In certain variations, an electromagnetic interference shield serves as a microwave absorber that can exhibit both high transparency (greater than about 65% average transmittance) in the visible light range and near-unity absorption (about 99.5% absorption at 13.75 GHz with a 10 GHz bandwidth) in the $K_u$-band. The shielding device is based on an asymmetric modified Fabry-Pérot cavity like that shown in FIG. 2, which incorporates a monolayer of graphene and an ultrathin (e.g., 8 nm thickness) copper-doped silver layer as absorber and reflector, along with a fused silica middle dielectric layer. In one aspect, the peak absorption frequency of the resonator cavity can be tuned by changing the thickness of the dielectric spacer layer. With electrical gating, the microwave absorption range of assembly 100' can be further tuned even when the dielectric layer thickness is fixed. The present disclosure thus contemplates a viable solution for a new microwave absorber with high visible transmittance, which has broad applicability, including for various optic devices.

An ultrathin metal layer having a thickness of about 8 nm comprising a continuous doped silver (Ag) film is formed by introducing a small amount of copper in a co-sputtering deposition process with Ag, as described more fully in U.S. Patent Publication No. 2017/0200526.

In such processes, for example, in the magnetron sputtering device 170 shown in FIG. 5, precursor material targets, such as first metal target 172 (e.g., Ag target) and second metal target 174 (e.g., Cu target), are bombarded by gas ions (such as argon ions, $Ar^+$) from a first sputter gun 176 and a second sputter gun 178 respectively, in a vacuum chamber 180. The first and second sputter guns 176, 178 are respectively connected via conduits 182 to a power source 184, such as a DC power source. The ions dislodge (sputter) material from the first and second metal target(s) 172, 174 to form a first material stream 186 and a second material stream 188 in the high vacuum chamber 180. The sputtered first and second material streams 186, 188 are focused with a magnetron 190 and condensed onto the receiving substrate 192 to form an alloy film or coating 194. As shown in FIG. 5, the substrate 192 is rotatable to provide even coverage of the first metal (e.g., Ag) and the second metal (e.g., Cu) during the co-depositing. Further, as shown, the first sputter gun 176 that bombards the first metal target 172 may have a fixed or steady amount of power, so that the flow rate of sputtering remains relatively constant, while the second sputter gun 178 may have a variable power to adjust the rate of sputtering of the second metal from the second metal target 174 during the process to permit adjustment of the amount of the second metal present in the deposited film or coating 194. Thus, in one example, the first sputter gun 176 may have a fixed power level of 300 W, while the second sputter gun 178 has variable power. The vacuum chamber 180 also has a viewing window 196 and a gauge 198 for monitoring the deposition process. It should be noted that the dielectric and thin-doped metal layer can be deposited sequentially on a flexible plastic web in a continuous manner in a roll-to-roll sputtering tool, providing high throughput for mass production.

In alternative processes, such as CVD or thermal CVD process, precursors are reacted at predetermined at temperature ranges and directed towards the substrate. CVD deposition can also be plasma-assisted. The deposited silver-based thin film may have any of the compositions or characteristics described above. In certain aspects, the methods of the present disclosure involve co-deposition of small amounts of Cu or other conductive metal during Ag deposition to form a film. The methods enable simple processing that is highly scalable to industrial and commercial manufacturing.

In other variations, the methods may further comprise annealing the deposited film after the co-depositing process or heating the substrate during the deposition. The annealing may include exposing the deposited film to a heat source so as to elevate the temperature of the film. In certain aspects, for the annealing process, the film may be exposed to temperatures below the melting points of either the silver or the conductive metal. Silver has a melting point of about 961° C., while copper has a melting point of about 1,085° C. In certain aspects, the material may be exposed to less than or equal to about 600° C., and optionally less than or equal to about 500° C., optionally less than or equal to about 400° C., optionally less than or equal to about 300° C., optionally less than or equal to about 200° C., and for certain substrates having the conductive metal film thereon like plastic or polymers, optionally less than or equal to about 100° C. The annealing may be conducted in an inert atmosphere, such as in nitrogen ($N_2$) gas, or in air. The amount of time for conducting the annealing process depends upon the temperature, where higher temperatures require less time.

In certain aspects, the time for annealing may range from greater than or equal to about 5 minutes to less than or equal to about 30 minutes and optionally greater than or equal to about 10 minutes to less than or equal to about 20 minutes. Annealing improves the deposited film's optical loss, especially for wavelengths in the visible range, making the silver-based film comprising the conductive material more like pure silver, while retaining the desirable electrical conductivity, smoothness, transparency, and other desired characteristics. Experimental results suggest that high temperature annealing makes the doped film itself more conductive, and that such an annealed film is robust against exposure to high temperatures and thus provides greater stability. In certain variations, the annealing may be done in a nitrogen ($N_2$) environment at about 150° C. for 15 min, which results in an observed drop in sheet resistance as discussed below.

The methods may further comprise applying additional materials onto a substrate prior to co-depositing the silver and conductive metal, for example, the first or second layer. In other variations, one or more additional material layers or films may be formed over the electrically conductive thin film comprising silver and conductive metal, like copper after deposition.

This ultrathin doped-silver layer is incorporated into a transparent EMI shielding device. The electromagnetic Ag shielding (EMAGS) film assembly or stack can comprise a conductive dielectric layer-ultrathin metal-conductive dielectric layer to minimize the electrooptical trade-offs, for example, to transmit approximately 96-97% visible light relative to the underlying substrate material, while showing excellent average EMI shielding effectiveness (SE) of about 26 dB, over a broad bandwidth of 32 GHz (from greater than or equal to about 8 GHz to less than or equal to about 40 GHz), covering the entire X, $K_u$, $K_a$ and K bands. EMI shielding efficiency of greater than or equal to about 30 dB can be obtained by duplicating the stacks within the shield device (simply stacking two EMAGS film assemblies together). Such embodiments can have even greater shielding effectiveness of up to 50 dB by separating two layers with a quarter-wavelength spacing layer.

FIG. 4 shows an example of such an electromagnetic interference shield 200. The electromagnetic interference shield 200 is similar to the electromagnetic interference shield 100 in FIG. 2, thus to the extent that they are not discussed again, the components or their function share the same numbering and can be considered to be the same as those components described in the context of FIG. 2. A stack assembly 210 includes a plurality of layers, including a first stack 20A and a second stack 20B. The first stack 20A includes a substrate 30. The first stack 20A also has an ultrathin metal layer 40 surrounded by a first layer 50 and a second layer 52. The second stack 20B also includes an ultrathin metal layer 40 surrounded by a first layer 50 and a second layer 52. A capping layer 220 is disposed over the second layer 52 to define the second stack 20B. The capping layer 220 may be formed of a material that is transparent to visible light. The capping layer 220 can further function as an anti-reflection layer for the incident electromagnetic waves, and simultaneously function as protection and barrier layer for gas and water vapors. The capping layer 220 can be made of organic material, an organic material, or a combination of both. A spacer or spacing layer 222 is disposed between first stack 20A and second stack 20B. The spacing layer 222 may be like spacing layer 122 in FIG. 2 and thus may be selected to have a thickness of a quarter-wave ($\lambda/4$) of the peak wavelength of the second range to be reflected or absorbed. The spacing layer 222 may be formed of the same materials as spacing layer 122, such as fused silica, by way of example. As will be appreciated by those of skill in the art, while not shown additional layers or stacks may be present within the stack assembly 210 of electromagnetic interference shield 200. For example, the presence of one or more additional stacks can increase shielding effectiveness of the electromagnetic interference shield 200, albeit potentially slightly reducing transmissivity of visible light in such a configuration.

Additionally, the electromagnetic interference shielding devices incorporating a stack comprising an EMAGS film may be flexible and thus demonstrate stable EMI shielding performance under mechanical deformation. In addition, large-area EMAGS films can be formed via a roll-to-roll sputtering system that is suitable for mass-production. The electromagnetic interference shielding devices provided by various aspects of the present disclosure provide outstanding optical, broadband EMI shielding, and mechanical properties making it particularly advantageous in various applications, including in healthcare, electronic safety, roll-up displays, and wearable devices, among others.

EXAMPLES

Various embodiments of the inventive technology can be further understood by the specific examples contained herein. Specific Examples are provided for illustrative purposes of how to make and use the compositions, devices, and methods according to the present teachings.

Example 1

Film deposition. Generally, the percolation threshold of pure Ag is typically between 10-20 nm, which is the critical thickness to form a continuous and conductive film. However, the conductivity of thin Ag films is largely affected by its high surface roughness (e.g., the root-mean-square (RMS) roughness of the 15-nm Ag film is about 6 nm), which will consequently limit its EMI shielding function. In addition, a thick Ag film blocks a large amount of visible light due to the inherent property of the metal. Therefore, for use in electromagnetic interference shielding, the silver metal film must be continuous and smooth at a thin thickness. FIG. 5 shows the simple co-sputtering process to produce the smooth and ultrathin Cu-doped Ag film. The Ag atoms are immobilized by the Cu atoms instead of aggregating into islands, leading to ultra-thin (thickness of about 8 nm) and smooth Ag films. Additionally, the Cu-doped Ag film exhibits much lower sheet resistance ($R_s$) than aluminum (Al)-doped Ag at the same thickness. For example, the Cu-doped Ag film at 8 nm exhibits much lower sheet resistance (12.5 ohm/square) than aluminum (Al)-doped Ag film (22 ohm/square). In addition, by comparison, the 9 nm pure Ag is not electrically conductive at all.

ITO/Cu-doped Ag/ITO flexible films were prepared using a roll-to-roll (R2R) magnetron sputtering tool at room temperature on PET (polyethylene terephthalate) substrates. The PET substrates are approximately 50 μm thick with both sides coated with acrylate hard coatings and are pretreated on-line with oxygen and argon plasma exposure, which can clean the substrates and simultaneously enhance the adhesion between the substrate and the coated films. Both the bottom and top ITO layers were deposited at a rate of 50 nm·m/min with the source power held at 6 kW. The middle Cu-doped Ag ultra-thin layer is deposited via the co-sputtering of Cu and Ag targets with source power held at 0.5 kW and 4 kW (as described more extensively in U.S. Patent Publication No. 2017/0200526 to Guo et al. and shown in FIG. 5), which translates into deposition rates of 8 nm·m/min and 29 nm·m/min, respectively. The overall rolling speed is controlled as 2.5 m/min.

Film Characterization

The thickness of Cu-doped Ag films was calculated by the calibrated deposition rates, which was further confirmed by the spectroscopic ellipsometry measurement (J. A. Woollam M-2000). A refractive index of Cu-doped Ag was measured by the spectroscopic ellipsometry (ESI). The morphology of the films was investigated by SEM (FEI HELIOS Nanolab 600i) and tapping mode AFM (Bruker Dimension FastScan). Crack images of films were taken using stereomicroscope (Nikon SMZ1500).

Measurements

The EMI shielding measurements were performed using a waveguide method system. Four different waveguides (Xibao Co. China) were applied to measure shielding performance in the X, $K_u$, K and $K_a$ bands. A rectangular waveguide, two waveguide-to-coaxial adapters, and a vector network analyzer (KEYSIGHT N5234A) were used to measure scattering parameters. The EMI SE, microwave reflection (R), and absorption (A) of films could be calculated through scattering parameters directly. The two waveguide-to-coaxials were connected to the ends of the rectangular waveguide, and the films were inserted into the waveguide. The films were cut into different dimensions to precisely fit the waveguides for the measurements in different bands (X—22.7×10×0.05 mm$^3$, $K_u$— 15.6×7.7×0.05 mm$^3$, K—10.5×4.2×0.05 mm$^3$, $K_a$—7.0×3.4×0.05 mm$^3$). The incoming electromagnetic wave was normally incident on the test samples. The optical transmittance and reflection of the films were measured by UV-Vis-Infrared spectrophotometer (PerkinElmer Lambda 950) in the range from 300 to 1000 nm at normal incidence. Sheet resistance ($R_s$) of the film was measured using four-point probe system and was an average result for at least six domains of each sample.

An ultrathin (e.g., thickness of about 8 nm) copper (Cu)-doped Ag film is formed by introducing a small amount of Cu into Ag film via a co-sputtering process, and extending it into a dielectric-metal-dielectric (DMD) stack configuration to solve the trade-off issue between transparency and microwave shielding of traditional EMI shielding materials. The sandwiched ultrathin metallic film maintains the high conductivity of Ag material itself and is ultra-smooth (e.g., a surface roughness <1 nm) and low optical loss, thereby providing both high transparency and shielding capability. Transparent conductive dielectrics functioning as effective anti-reflection (AR) layers are added adjacent to each side of the metallic layer, which further simultaneously improve the visible transmission and EMI SE, where the latter is achieved due to the enhanced conductivity of the whole stack. The experimental results of this electromagnetic Ag shield film (EMAGS) stack shows an average EMI SE of 26 dB over a wide RF bandwidth with average 96.5% visible transmittance (with reference to a PET substrate), which are believed to be among the best shielding results reported. Such an electromagnetic interference shielding device also exhibits significantly improved EMI shielding stability under mechanical deformation. Further, an electromagnetic interference shielding device having two stacks or a double-layer of EMAGS (D-EMAGS) exhibits an average EMI SE of over 30 dB, and SE can be improved to greater than 50 dB in each band by separating the two stacks by a quarter-wavelength spacer layer. In addition, large-area EMAGS film stacks were demonstrated with roll-to-roll (R2R) sputtering, which indicates that the proposed EMI shielding devices are advantageous for mass-production over traditional patterned metallic structures.

Electromagnetic Interference Shielding Device Stack Design

The electromagnetic interference shield conductive stack configuration of the Cu-doped Ag layer sandwiched between two ITO layers on the PET substrate is shown in FIG. 6B. In order to get maximal light transmission, the thickness of the ITO as optical AR layers is optimized to make the reflected light beams cancel out as much as possible in the visible band by destructive interference, as discussed previously. For this purpose, the average transmittance (400-700 nm) of the three-layer structure is calculated by varying thickness of the top and bottom ITO layers from 0 to 100 nm with the Cu-doped Ag central layer fixed at a thickness of 8 nm using transfer matrix method. It can be seen in the FIG. 6C that an average transmittance is dependent on the thickness of the dielectric layers adjacent to the ultrathin metal layer. Maximum transmittance is achieved when both top and bottom ITO layers have a thickness of about 40 nm. In one variation, the electromagnetic interference shield EMAGS film has a design with ITO (40 nm thickness)/Cu-doped Ag (8 nm thickness)/ITO (40 nm thickness). It should be noted that other transparent conductive dielectric materials with similar refractive index to ITO, such as zinc oxide (ZnO) and fluorine doped tin oxide (FTO), can also be used as alternative variations of the AR layers in the stack structure. However, ITO is selected in due to its stability and relatively high conductivity, which can boost the shielding performance of the electromagnetic interference shield EMAGS film. FIGS. 6D and 6E show the scanning electron microscopy (SEM) images of the Cu-doped Ag central layer and the electromagnetic interference shield EMAGS stack. The 8 nm Cu-doped Ag film is smooth and free of 3D islands (RMS roughness about 0.42 nm) compared to rough thin pure Ag films. After coating ITO layer, the RMS roughness of the electromagnetic interference shield EMAGS film slightly increases to about 1.21 nm, but ensures overall smoothness.

Optical Property of Electromagnetic Interference Shield (EMAGS) Stack

The electromagnetic interference shield (EMAGS) stack of films is subsequently sputtered on the PET substrate using a roll-to-roll (R2R) sputtering system at room temperature, which demonstrates significant advantages over traditional metal patterned structures for mass-production. FIGS. 7A(1)-7A(2) and 7B are photographs of the fabricated sample. FIG. 7A(1) demonstrates the highly transparent 2 cm×2 cm electromagnetic interference shield EMAGS film stack, through which the underlying logos can be observed clearly. FIG. 7A(2) is the bending state of the same electromagnetic interference shield EMAGS film stack, showing great flexibility. A large-area (200 cm×50 cm) electromagnetic interference shield transparent EMAGS film stack fabricated by the roll-to-roll method is being held in FIG. 7B.

The measured optical transmittance in the range of 300-1,000 nm of the electromagnetic interference shield EMAGS film stack is presented in FIG. 7C. For comparison, the transmission of the ITO (approximately 40 nm thick, the same as the ITO layers used in electromagnetic interference shield EMAGS stack films), PET substrate, and 8 nm Cu-doped Ag layer are plotted. It should be noted that the transmission of EMAGS stack films, ITO, and Cu-doped Ag films are relative values with reference to the PET substrate, which has an average visible transmittance (400-700 nm) of 88.1%, as shown in FIG. 7C. The average transmittance of the EMAGS stack film exceeds 96% (peak transmittance of 98.5% at 600 nm) in the visible range, which is much higher than both the pure Cu-doped Ag and ITO layers. This is due to the optimized stack configuration and the suppressed reflection via AR dielectric layers as shown in FIG. 7D. The optical reflection of the EMAGS film in the 400-700 nm wavelength range is much lower than that of the Cu-doped Ag film, and even lower than the PET substrate.

EMI Shielding and Electrical Property of EMAGS Stack

The electromagnetic interference (EMI) shielding effectiveness (SE) of a material is defined as the logarithmic ratio of incident power to that of the transmitted power and is normally expressed in decibel unit. Higher EMI SE values mean stronger power attenuation and negligible electromagnetic wave passing through the shielding materials. For commercial shielding applications, such as mobile phones and laptop computers, an EMI SE of 20 dB is required, which corresponds to only 1% transmission of the incoming electromagnetic wave. To investigate the EMI shielding performance, the EMAGS stack films deposited on PET are measured using a waveguide configuration.

The measured radio frequency (RF) bands are as broad as 32 GHz, which covers the bands of X (8-12 GHz), $K_u$ (12-18 GHz), K (18-26.5 GHz), and $K_a$ (26.5-40 GHz). For different microwave bands, the EMAGS stack samples fit specific waveguides. Before measurements, the two port thru-reflect-line calibration is used to correct the system, which introduces a 12-term error correction at each frequency.

FIGS. 8A-8D show the EMI SE of the EMAGS stack films prepared in accordance with certain aspects of the present disclosure in different frequency bands across the 8-40 GHz range. As a comparison, the ITO film and the PET substrate are also measured. A pure PET film without other layers is completely transparent to electromagnetic waves, with the EMI SE of nearly 0 dB in the entire measured bands. The small peaks in the higher frequency band (FIG. 8D) are caused by the interference between reflections from top and bottom interfaces of the PET. Though the entire frequency range of 8-40 GHz, the EMAGS stack prepared in accordance with the present disclosure exhibits an excellent shielding performance, with average EMI SE of nearly 26 dB (FIGS. 8A-8D), which blocks approximately 99.7% of the radiofrequency (RF) power. More importantly, there is no roll-off behavior of the SE when the frequency increases, which results in the effective and indiscriminate shielding performance across a wide range. This broad (32 GHz bandwidth) and efficient (≥20 dB) EMI SE of the electromagnetic interference shield EMAGS stack film in accordance with certain aspects of the present disclosure outperform most previously-reported EMI shielding materials based on patterned metal structures. For instance, the EMI SE of a square metal-mesh shield structure decreases rapidly in a narrow band, which shows a 5-dB decrease even within the $K_u$ band. The same EMI shielding roll-off behavior at high frequencies is also found in the conventional ring-based and cracked-based metal-meshes due to the high transmission of electromagnetic waves at shorter wavelengths through the patterned opening.

As a comparison, FIGS. 8A-8D also display the SE of the 8 nm Cu-doped Ag (approximately 23 dB) and 40 nm ITO (approximately 19 dB) films, both of which are lower than that of the electromagnetic interference shield EMAGS stack structure. The shielding performance of the double-layer electromagnetic interference shield EMAGS (D-EMAGS) stack is investigated by incorporating two EMAGS film stacks together. It presents the EMI SE above 30 dB from a range of frequencies from 8 to 40 GHz, with a peak efficiency of 39 dB at 29 GHz. Fluctuations in the measured curves of the D-EMAGS film are attributed to the multiple reflections between the two EMAGS stacks. The average transmittance of the D-EMAGS in the visible range is about 93%. To exploit the shielding potentials of the D-EMAGS electromagnetic interference shield structure, the two EMAGS stacks are further separated by a spacer equal to a quarter of the center wavelength in each band. Ultrahigh SE is achieved by these configurations, with average SE of greater than about 50 dB.

When the electromagnetic wave is incident on the shielding materials, the incident power can be divided into reflected (R), absorbed (A), and transmitted power (T) with the relationship that A+R+T=1. Using the scattering parameters of the electromagnetic interference shield EMAGS film measured by the waveguide method, the microwave reflection and absorption in the range of 8-40 GHz is correspondingly calculated.

FIGS. 9A-9D show the measured microwave reflection and absorption of EMAGS films as a function of incident frequencies. More specifically, measured microwave reflection (R) and absorption of an electromagnetic interference shield EMAGS film prepared in accordance with certain aspects of the present disclosure in the X-band (8-12 GHz) (FIG. 9A), $K_u$-band (12-18 GHz) (FIG. 9B), K-band (18-26.5 GHz) (FIG. 9C), and $K_a$-band (26.5-40 GHz) (FIG. 9D). FIG. 9E shows calculated power loss density within each layer of the ITO/Cu-doped Ag/ITO structure at 12 GHz using CST microwave studio. FIG. 9F shows calculated shielding contribution from R and A of the 1) Cu-doped Ag, 2) ITO/Cu-doped Ag, and 3) ITO/Cu-doped Ag/ITO structures. Simulated power flow within the structure of the FIGS. 9G(1) Air, 9G(2) ITO, 9G(3) ITO/Cu-doped Ag, and 9G(4) ITO/Cu-doped Ag/ITO structures at 12 GHz using CST microwave studio are shown. The white arrows in FIGS. 9G(1)-9G(4) denotes the incident electromagnetic wave direction.

Overall, the average reflection and absorption are 88.5% and 11.2% of the incident power, respectively. 12 GHz frequency is used as an example to look into the shielding contribution from reflection and absorption of different structures: 1) Cu-doped Ag, 2) ITO/Cu-doped Ag, and 3) ITO/Cu-doped Ag/ITO. The results are summarized in FIG. 9E. From the bar chart, it is obvious that the shielding is mainly caused by the strong reflection for all the structures. Moreover, from 1) to 3), there is an upward trend for the reflection, rising from 86.2% to 90.2%, while absorption experiences a decline, indicating that the shielding enhancement is originating from the increased reflection. At microwave frequencies, the real (n) and imaginary (k) parts of refractive index of the conductor (e.g., Cu-doped Ag and ITO) are on the order of 104, so the reflection at the first air-conductor interface is close to the unity. The follow-up reflection from back conductor-air interface will reduce the total reflection to some extent by producing the destructive interference. However, less microwave can reach the back conductor-air interface when the thickness of the conductor increases (e.g., adding more ITO layers in this case) and the influence of this secondary reflection on the total reflection intensity gets much weakened, which is consistent with the observation in FIG. 9E.

In addition to the dominant reflection, a certain portion of microwave is shielded through absorption inside the conductors. The microwave absorption contributed by the conductive dielectrics and metal layer, respectively, in the EMAGS structure are further examined. In FIG. 9F, the contour plot of the simulated power loss density shows that the metal layer contributes more in the microwave absorption because of its larger attenuation coefficients (higher n and k). Essentially, the ITO and Cu-doped Ag layers behave like three parallel resistors under the same electrical potential when the electromagnetic wave is incident upon the EMAGS structure. Therefore, a conductive element featuring lower resistance (i.e., Cu-doped Ag layer) will result in a relatively stronger Ohmic loss and higher microwave absorption. FIGS. 9G(1)-9G(4) illustrate the simulated power flow distribution within different structures at 12 GHz using CST microwave studio. By subsequently adding the 40 nm ITO and 8 nm Cu-doped Ag layers (FIG. 9G(2)-9G(4)), the entire incident EM field is blocked step by step due to both the reflection and absorption of these conductors and shows the minimal power transmission through the ITO/Cu-doped Ag/ITO structure.

The reflection-dominant mechanism and broadband EMI shielding performance can be more intuitively explained by viewing the ITO/Cu-doped Ag/ITO stacks as an effective single layer of high electrical conductivity. Due to higher density charge carriers per unit area, the highly conductive layer has a much lower impedance across the wide microwave range compared with that of the free space (377Ω). As a result, most of the incident electromagnetic waves are reflected back to the free space due to the large impedance mismatch at the air/EMAGS interface. In fact, the theoretical shielding bandwidth of the electromagnetic interference shield EMAGS film is much broader than the measurement range without any decrease in SE, which is verified by CST simulation in the ESI.

Mechanical Property of EMAGS

To evaluate mechanical flexibility of the electromagnetic interference shield EMAGS film prepared in accordance with certain aspects of the present disclosure, a change of the EMI SE of electromagnetic interference shield EMAGS stack films is measured as a function of the bending cycles and radius under repeated bending. The schematic of the bending setup is shown by the inset in FIG. 10A. Different bending radius (r) can be controlled through adjusting the distance (ΔL) between the two ends from the initial state (L). As shown in FIG. 10A, sheet resistance ($R_s$) of the EMAGS film remains almost unchanged after 250 bending cycles at a bending radius of 6 mm and slightly increases from 11.0 to 12.1 Ω/sq after 1,000 bending cycles. In contrast, $R_s$ of the 40 nm ITO film drastically increases from 29.5 Ω/sq to 123.0 Ω/sq after only 250 times bending. FIG. 10B shows the change of the EMI SE at 12 GHz as a function of bending cycles at the bending radius of 6 mm. In comparison, the same bending tests are carried out with ITO films. It is interesting to note that after 250 bending cycles, the EMI SE of EMAGS film remains its initial high performance, while there is a significant drop on EMI shielding of ITO film after only 50 bending cycles due to the large cracks on the surface (as shown by the inset SEM image in the plot). With the bending cycles increasing from 50 to 250, the EMI SE of the ITO film continues to decline, showing almost no shielding effect (<1 dB) after 250 times repeated bending. The inset in FIG. 10B provides the SEM image of EMAGS film after bending test, which is free of any visible cracks. This is consistent with stable $R_s$ and shielding performance of the proposed EMAGS film after extensive bending. Meanwhile, it is worth noting that measured $R_s$ and EMI SE of both ITO and EMAGS films matches well with the predicted relationship presented in FIG. 6A.

Then, a change of the shielding performance for different polarizations with the bending radius varying from 12 to 2 mm are investigated as shown in FIGS. 10C and 10D. Remarkably, the EMI SE of EMAGS film shows no decrease after 1,000 times of bending when bending radius is larger than 3 mm. When the radius (r) is reduced down to 2 mm, SE for transverse magnetic polarized (TM) waves (i.e., the electric field perpendicular to the crack lines as shown by inset in FIG. 10C) tends to decline with the increase of bending cycles. As illustrated in the plot at r=2 mm, the EMI SE decreased to 23 dB and 6 dB after 100 and 1,000 bending cycles, respectively. On the other hand, high SE remains after 1,000 times of bending for transverse electric (TE) polarization (i.e., the electric field parallel to the crack lines as shown by inset in FIG. 10D). The dependence of EMI SE on the polarizations is because the thin conductive films with crack lines after bending are essentially wire grid polarizers (WGPs) for RF waves considering the sub-wavelength distance between crack lines. Therefore, TM waves can easily go through, while TE polarization is effectively reflected. The same phenomena can be observed when bending ITO films. Regardless of the bending radius, EMI SE of ITO for TM waves drops significantly after 250 bending cycles (SE<5 dB), which contrasts the great flexibility of the electromagnetic interference shield EMAGS films prepared in accordance with certain aspects of the present disclosure. The TE polarization shows only a small decrease after 250 times bending even at a radius of 2 mm, which is consistent with the WGP model proposed for conductive thin films with bending crack lines.

SEM images in FIGS. 11A and 11B directly compare the surface morphologies of electromagnetic interference shield EMAGS stack and ITO films after bending tests at r=3 mm. At the same bending cycles of 250, the crack lines on the ITO films in FIG. 11B are much more pronounced than those of inventive EMAGS films shown in FIG. 11A. The shallow and narrow crack lines on the surface of the EMAGS films exhibits no influence on shielding as validated in FIGS. 10A-10D. The result indicates that the mechanical flexibility of the electromagnetic interference shield stack structure is significantly improved, which is due to both the high ductility of the thin Cu-doped Ag sandwiched between and the enhanced cohesive strength of ITO after adding the metallic interlayer. The flexible EMAGS film shows excellent EMI shielding stability under mechanical deformation, which enables their potential use as high-performance EMI shielding materials in flexible electronics. As summarized in FIG. 12, when considering both optical transmittance and microwave shielding performance, the electromagnetic interference shield (EMAGS) film outperforms various conventional transparent shielding structures and materials, including metal-meshes, graphene-based materials, graphene hybrid structures, silver nanowires, multilayer Ag/acrylate stack, and commercial transparent foils. Although EMI SE of Graphene/Metallic mesh structures could reach 29 dB at 12 GHz, the shielding is only for a narrow frequency range, dropping quickly to only 13 dB at 40 GHz.

A large-area, flexible film based on the ultrathin Cu-doped Ag with outstanding optical transmittance, broadband shielding performance, and excellent mechanical flexibility is provided in accordance with certain aspects of the present disclosure. The electromagnetic interference shield EMAGS stack film in such variations shows an average relative transmittance of 96.5% in the visible range, with a peak value of 98.5% at 600 nm. The average EMI SE is 26 dB, which is believed to be among the best shielding results ever reported at this transparency level for visible light. More importantly, it exhibits a broadband shielding covering a bandwidth of 32 GHz. EMI SE of over 30 dB is also contemplated by stacking multiple EMAGS films. Compared with the ITO film, no obvious degradation in EMAGS film was observed under repetitive bending cycles at a radius of approximately 3 mm, demonstrating the mechanical flexibility of the film. The proposed transparent EMAGS films hold great potential to be star materials in future RF shielding applications.

Example 2

In this example, a transparent microwave absorber (MA) based on an asymmetric Fabry-Pérot resonant cavity is formed by employing a stack including a graphene layer-dielectric layer-ultrathin doped silver alloy layer (GDS) configuration.

Graphene synthesis shown in FIG. 14: The graphene films were grown on 25 µm thick Cu foils (Alfa Aesar, 99.8% purity) using CVD method at the center of a tube furnace. The foils were subsequently heated to 1,000° C. under $H_2$ at 60 Pa for half an hour. Then, the carbon source ($CH_4$) was introduced into the quartz tube for 2 hours. After following gas mixtures, the samples are rapidly cooled down to the room temperature (25° C.). The fast cooling rate suppresses formation of multiple layers of graphene.

Graphene transfer: As-grown graphene on the Cu foils was transferred by spin-coating 5 µm thick polymethylmethacrylate (PMMA) on the graphene, as shown in FIG. 14. After PMMA dried, the sample was immersed into the Marble's etchant ($HCl:H_2SO_4:CuSO_4$=50 ml:50 ml:10 g) solvent to etch the Cu foil. After removal, the graphene samples were washed in distilled water and transferred to the 1 mm silica substrate to be used.

Film Deposition: ITO/Cu-doped Ag/ITO flexible films were prepared using a homemade magnetron sputtering (MS) tool at room temperature on PET (polyethylene terephthalate) substrates. The PET substrates are approximately 50 µm thick with both sides coated with acrylate hard coatings and are pretreated on-line with oxygen and argon plasma exposure, which can clean the substrates and simultaneously enhance the adhesion between the substrate and the coated films. Both the bottom and top ITO layers were deposited at a rate of 50 nm·m/min with the source power held at 6 kW. The middle Cu-doped Ag ultra-thin layer is deposited via the co-sputtering of Cu and Ag targets with source power held at 0.5 kW and 4 kW, which translate into deposition rates of 8 nm·m/min and 29 nm·m/min, respectively. The overall rolling speed for the roll-to-roll process is controlled as 2.5 m/min.

Characterization and measurements: ITO/Cu-doped Ag/ITO film thicknesses for each layer were calculated by the calibrated deposition rates and confirmed by the spectroscopic ellipsometry measurement (J. A. Woollam M-2000). The morphology of the graphene and ITO/Cu-doped Ag/ITO films were investigated by SEM (FEI HELIOS Nanolab 600i) and tapping mode AFM (Bruker Dimension FastScan) on fused silica and PET substrates, respectively. The optical transmittance of the films and GDS cavities were measured by UV-Vis-Infrared spectrophotometer (PerkinElmer Lambda 950) ranging from 300 to 1000 nm with normal incident radiation. The microwave transmission and reflection of the samples was calculated from the measured S-parameters using waveguide methods in the X and $K_u$ bands.

The electromagnetic interference shield (EMI) device stack assembly in this variation includes graphene, an ultra-thin-doped silver (Ag) film as a transparent microwave absorber and reflector, and fused silica as dielectric spacer. In addition, by using monolayers of graphene as building blocks and tuning dielectric spacer thickness to achieve critical coupling in the cavity, this device yields near-unity (approximately 99.5%) absorbance in the experiment and remains highly transparent (approximately 65%) in the visible range. Moreover, a broad bandwidth of absorbance is achieved due to the intrinsic loss of the graphene layer, and the measured bandwidth is 72.7% of the center resonant frequency at 13.75 GHz.

Design and Fabrication of the Transparent Microwave Absorber

Materials with high dissipation need to be incorporated in the resonant cavity design for energy harvesting/absorption. Graphene, with partially microwave absorbing and reflecting properties, can be an efficient candidate as the top absorbing medium for the Fabry-Pérot cavity. Additionally, silver (Ag) is chosen as the back reflection mirror, because it is highly electrically conductive for strong power reflection in the microwave regime and has the lowest absorption loss among metals in the optical range. A schematic view of the proposed visibly transparent MA utilizing cavity resonance behavior is shown in FIGS. 2 and 13A-13B. The device structure comprises a monolayer of graphene, an ultrathin Ag alloy comprising copper surrounded by two indium tin oxide layers, and a fused silica layer (disposed between the graphene and one of the indium tin oxide layers). Here, by introducing a small amount of Copper (Cu) into Ag during the co-deposition process like that shown in FIG. 5, a continuous ultrathin (8 nm) and ultra-smooth electrically conductive alloy film is formed by suppressing the Volmer-Weber growth mode of Ag.

One strategy to increase optical transmittance of the ultrathin-doped Ag film is to employ anti-reflection coatings; hence, the ultrathin-doped Ag layer is sandwiched between the two indium tin oxide (ITO) layers, while simultaneously maintaining excellent conductivity. This provides ultralow microwave transmission from the cavity. Finally, the microwave reflection mirror is realized in the form of ITO (thickness of 40 nm)/Cu-doped Ag (thickness of 8 nm)/ITO (thickness of 40 nm) stack. The thickness of ITO layers is optimized to maximize the overall transparency by using calculated results employing the transfer matrix method (TMM).

FIGS. 13C(1)-13C(2) show the scanning electron microscopy (SEM) and atom force microscope (AFM) images of the graphene film on the silica substrate after being transferred from the Cu foil, respectively, demonstrating excellent continuity without macroscopic defects. Small white dots in FIG. 13C(2) are the PMMA residuals after removal process. To verify the number and the quality of prepared graphene, the Raman spectrum is measured with the laser wavelength of 532 nm as shown in FIG. 13C(3). It exhibits typical peak features as monolayer graphene, including G and 2D bands. The 2D band exhibits a single Lorentzian feature with a full width at half maximum (FWHM) of approximately 26 cm$^{-1}$ located at about 2686 cm$^{-1}$ and a larger intensity relative to the G band. In addition, the intensity of D band at approximately 1350 cm$^{-1}$ is below the Raman detection limit, which proves the absence of a significant number of defects. Afterwards, the Fermi energy level of graphene is determined by comparing the G and 2D peak positions measured, with the characterized correlation (f) estimated as f=~0.3 eV.

Next, for ease of experimental realization, doped Ag and ITO layers are deposited on a PET substrate. SEM and AFM images of the as-deposited ITO/Cu-doped Ag/ITO are shown in FIG. 13D, all showing the continuous and smooth surface morphologies. Eventually, FIG. 13E shows optical micrographs of silica, graphene film onto the silica, and the ultimate GDS cavity samples prepared in accordance with certain aspects of the present disclosure. The monolayer graphene film on the silica (in the middle) is highly transparent with little transmittance loss compared with the pure silica (left). The GDS cavity with the size of 2.2 cm×1.1 cm (right) also shows a favorable transparency.

Theoretical Condition and Experimental Verification for Perfect Microwave Absorption As shown in FIG. 15A, eight parameters ($n_1$, $n_2$, $k_2$, $n_3$, $n_4$, $k_4$, $d_2$, $d_3$) are involved in designing the transparent electromagnetic inference shield/microwave absorber (MA) in this configuration considering that the metal layer thickness is fixed to ensure transparency. It is effective to describe the graphene's property using its surface conductivity (τ) because this quantity can be modeled or measured directly in a broad regime ranging from radio to optical frequencies, and the corresponding refractive index (n) and extinction coefficients (k) can be derived from the conductivity. For theoretical analysis, the conductivity of the graphene could be calculated from Kubo formula with inter-band and intra-band contributions, and is estimated using the following expressions, $$\sigma_{intra} = i\frac{2e^2 k_B T}{\pi\hbar^2(\omega + i\Gamma)} \ln\left(2\cosh\frac{\mu_c}{2k_B T}\right) \quad (1)$$

$$\sigma_{inter} = \frac{e^2}{4\hbar}\left[\frac{1}{2} + \frac{1}{\pi}\arctan\left(\frac{\hbar\omega - 2\mu_c}{2k_B T}\right) - \frac{i}{2\pi}\ln\frac{(\hbar\omega + 2\mu_c)^2}{(\hbar\omega - 2\mu_c)^2 + (2k_B T)^2}\right] \quad (2)$$

where e is the electron charge, $k_B$ is the Boltzmann constant, T is the temperature, h is the reduced Planck constant, ω is the frequency of the incident electromagnetic waves, and Γ is the relaxation time, which is assumed to be independent of energy. It is worth noting that graphene's conductivity strongly depends on the value of its Fermi energy level $\mu_c$ which can be controlled by chemical doping or electrostatic gating (for example, as described in the context of FIG. 3), quantifying the electronic transport property. On the other hand, the ITO/Cu-doped Ag/ITO stacks (reflection mirror) can be modeled as an effective single layer with high electrical conductivity, as most of the contribution comes from the most conductive element Ag.

The theoretical condition for perfect microwave absorption is considered in the planar graphene layer through the whole GDS cavity. For simplicity, it is assumed that only the top graphene is lossy and the bottom reflection layer can be regarded as perfect electric conductor, thus providing 100% reflectivity. An analysis method is introduced for the absorbing structures used in the optical applications, where the absorption rate per unit length normalized to the incident microwaves could be expressed as:

$$A_{pul}(z, f) = \frac{4\pi n_2 \kappa_2 f}{cn_1} \frac{|E(z)|^2}{|E_0|^2} \quad (3)$$

where $E(z)$ is the electric field in the ultrathin graphene film, $E_0$ is the incident electric field, c is the light speed in the vacuum, and f is the frequency of the incident electromagnetic wave. Therefore, the total absorption in the graphene film is:

$$A_{total}(f) = \frac{4\pi n_2 \kappa_2 f}{cn_1} \frac{\int_0^{d_2} |E(z)|^2 dz}{|E_0|^2} \quad (4)$$

Generally, the ideal thickness of mono-layer graphene $d_2$ is approximately 0.34 nm, while in sharp contrast, the incident wavelengths at microwave ranges are on the order of millimeters, which indicates that $d_2 \ll \lambda$. Consequently, a graphene sheet layer minimally changes the electric field profile inside the structure, and the electric field can maintain its intensity, which is also validated by calculating the electric field distribution within the graphene layer at different frequencies. In view of the zero reflection in the critical coupling condition, it can be assumed that, $$E(z)=E(z=0)=E_0, 0 \le z \le d_2 \quad (5).$$

Substituting Equation (5) into (4) and perfect microwave absorption condition gives that ($A_{total}$=100%), provides, $$\frac{4\pi n_2 \kappa_2 d_2 f}{cn_1} = 1 \quad (6)$$

Hence, for unity absorption of the graphene layer, the parameters should satisfy the above relationship. The dotted line in the FIG. 15B plots the calculated values of $4\pi n_2 \kappa_2 d_2 f/cn_1$ for normal incidence, revealing that perfect absorption can be achieved in the GDS cavity by the graphene film at around 15 GHz theoretically under the condition of $\mu_c$=0.3 eV, $\Gamma$=20 ps.

Furthermore, by employing TMM, the reflection (R) and absorption (A=1−R) of the GDS cavity is calculated at predetermined frequencies. In consideration of the symmetry of the cavity in the X-Y plane, the device is believed to be independent of polarization at normal incidence. In the following numerical calculations, only TE-polarized incident microwaves are taken into consideration. FIG. 15C gives the calculated absorption map as a function of different graphene Fermi levels and frequencies at the dielectric thickness $d_3$ of 3 mm. It illustrates that the near-unity absorption of the GDS cavity can be achieved with different Fermi levels in the region A (black dotted circle), which also denotes that the conditions for achieving strong absorption are not very strict. In addition, the ideal perfect absorption is attained with $\mu_c$=approximately 0.3 eV at near 15 GHz, which is consistent with the predicted result. FIG. 15D shows the calculated absorption by varying the dielectric thickness (ranging from 0 to 15 mm) at different excitation frequencies. As shown in FIG. 15D, the absorption peaks occur periodically with the increase of frequencies at a fixed dielectric thickness, as well as with the growth of the dielectric thickness at a particular frequency. Specifically, when the dielectric thickness $d_3$ varies from 1 to 15 mm, the absorption peak shifts continuously from ≈40 GHz to ≈2 GHz. Meanwhile, several higher modes start to appear with thicker cavities and higher frequencies, showing like wrinkles on the absorption map. Hence, it is obvious that the peak absorption frequencies can be readily tuned by changing the dielectric thickness of the cavity. Note that at a fixed dielectric thickness (e.g., $d_3$=6 mm), the bandwidth of lower-order resonances is slightly broader than that of higher-order modes (black dashed lines in FIG. 15D), which increases the operating bandwidth and provides better tolerance to experimental verification.

To confirm the experimental microwave absorption performance of the GDS cavity, the microwave transmission (T) and reflection (R) are measured at normal incidence using waveguide configuration, and then used to calculate absorption, which is defined as A=1−T−R, where R=$|S_{11}|^2$ and T=$|S_{21}|^2$ are obtained from the measured S-parameters. First, by analyzing the microwave responses of the GDS cavity layers individually, the respective role of each layer is investigated. The microwave transmission and reflection of the monolayer graphene on silica substrate and the ITO/Cu-doped Ag/ITO on PET substrate in the X and $K_u$ bands are plotted. As predicted, the monolayer graphene is partially reflective and absorptive to the microwaves with averages of approximately 25% reflection and approximately 45% transmission. On the other hand, the ITO/Cu-doped Ag/ITO layer supports a broadband high reflection, corresponding to only about 0.3% transmission, which is nearly perfect as a microwave reflection mirror.

Then, the absorption performance of the GDS cavities prepared in accordance with certain aspects of the present disclosure are explored. From model calculations using TMM, numerical CST simulation, and experimental measurements, the absorption spectra in the X and $K_u$ bands of the GDS cavity are plotted with silica thickness $d_3$ ranging from 1 mm to 4 mm as shown in FIG. 16A-16F. With the increase of the dielectric thickness, the location of the absorption peaks gradually red-shifted to the low frequencies and was able to be tuned across the entire measured spectrum from 8 to 18 GHz. The calculated and simulated normal incidence spectra for four different thicknesses ($d_3$=2.5 mm, 3 mm, 3.5 mm, 4 mm) of silica show near-unity absorption at resonances with maximum absorption values all exceeding 99.5%. The overall shape, trend and position of the experimental features in FIGS. 16E and 16F match quite well with the calculated and simulated results. As characterized by the purple curves ($d_3$=3 mm) in FIGS. 16E and 16F, the measured absorption reaches a maximum of 99.5% at 13.75 GHz, showing that the near-unity absorption is achieved. At the same time in the case of $d_3$=3 mm, broadband absorption is obtained with the measured absorption of >50% from 8 GHz to 18 GHz, covering the entire X and $K_u$ bands, while all maintaining ultralow microwave transmission through the cavities. For the other cases where $d_3$=2.5 mm, 3.5 mm and 4 mm, the maximal absorption values all exceed 98% at their resonant frequencies.

Asymmetric Fabry-Pérot Cavity

In order to get a better understanding of the extraordinary microwave absorption, numerical calculations using TMM of the electromagnetic responses, including electric field and absorbed power distributions within the whole cavity ($d_3$=3 mm) at concerned wavelengths, are presented in FIGS. 17A-17B. It is noteworthy that the resonance modes in the top graphene layer appear at approximately 13 GHz (designated #1) and approximately 40 GHz (designated #2), as shown in FIG. 17A, which matches well with the perfect absorption frequencies at the dielectric thickness of 3 mm in FIG. 15D. The enhanced electric field distribution at resonances further unveils the reason for strong absorption in the graphene layer of the cavity as the power absorption is directly proportional to the electric field intensity. Although it is shown that the electric field intensity at 25 GHz (designated #3) is the highest in the GDS cavity at this thickness, it locates at the middle silica layer, the absorption performance could be still be poor due to the fact that the silica layer is lossless in the microwave range.

Subsequently, the absorbed power distribution is calculated as a function of frequencies at the same GDS cavity thickness. In FIG. 17B, the intensive absorption positions (#1 and #2) correspond well with the regions in FIG. 17A, where the electric field is highly concentrated. Furthermore, it is obvious that nearly all the microwave power is absorbed by the top graphene layer. As for the bottom Ag layer, even though the electric field is very weak, there is still little power absorbed by the Ag due to its large attenuation coefficient in the microwave range. It should be noted that the thickness of each layer is not drawn to scale (e.g., the monolayer thickness is enlarged greatly) in the contour plots, so the number of the sampling points in each layer is adjusted to give a more intuitive contrast in FIGS. 16A-16F with the same color distributions as the original plot.

In fact, the GDS cavity resembles an asymmetric Fabry-Pérot (FP) cavity comprising a lossless dielectric core with a partially reflective top layer and back reflector. At resonances, microwave beams reflected from the air/graphene and the silica/metal interfaces form destructive interference, resulting in zero reflection. The interference condition is associated with the single or multiple round-trip phase shifts of electromagnetic wave inside the resonant cavity, which accounts for the period absorption peaks in the FIG. 15D at a fixed dielectric thickness. Nevertheless, the electromagnetic interference (EMI) shield assemblies are distinctive from a conventional symmetric FP cavity. Traditional FP resonator exhibits highly frequency selective feature (high Q) in their reflection or transmission spectra, and in that case the transmission process does not involve any energy conversion or absorption. Note that by incorporating lossy graphene layer in the FP cavity, the structure can yield substantial power absorption.

Optical Performance

To characterize the optical property of the electromagnetic interference (EMI) shielding GDS resonator cavity, optical transmittance spectra is measured in the range of 300-1000 nm of the individual layers and GDS assembly/cavity with different dielectric thicknesses, as shown in FIGS. 18A-18B. The as-prepared graphene and silica substrates (0.5 mm and 1 mm) show nearly flat transmission spectra in the visible and near infrared regions, with 96.7%, 93% and 92% visible transmittance at 550 nm respectively. For the silica substrates, the one with greater thickness has a slightly lower transmittance because of the reduced absorption in the materials. The overall average transmittance of the ITO/Cu-doped Ag/ITO on PET substrate is 88.1% in the visible band, and the improved transparency is due to anti-reflection coatings on the Cu-doped Ag layer. Moreover, at longer wavelengths, it approaches that of a perfect conductor and its reflection increases towards the infrared regime. Consequently, film transmittance gradually drops as depicted in the red curve in the FIG. 18A, but remains a relatively high value (e.g., 65% at 900 nm).

Similar to the ITO/Cu-doped Ag/ITO layer, there is a downward trend of transmittance spectra for electromagnetic interference (EMI) shielding assembly GDS resonator cavities with the increase of wavelengths at different dielectric thicknesses in the near infrared range. On the other hand, as depicted in the FIG. 18B, the transmittance drops when the silica layer thickness increases, which is attributed to the reflection loss at interfaces and little absorption loss in the substrates. In fact, in these experiments, each different dielectric thickness for the cavity (1 mm to 4 mm) is simply a stack of different combinations of 0.5-mm and 1-mm silica substrates, and air gaps in between the glass slides are inevitable. As a result, the stepped optical losses in the transmission spectra (e.g., from 1.0 mm to 1.5 mm/from 2.0 mm to 2.5 mm/from 3.0 mm to 3.5 mm) is mainly caused by the reflection loss on the air/silica interface in the cavities. Thicker cavities are composed of more silica substrates, hence introducing more reflection loss at interfaces. The slight transmittance drop from the adjacent solid to the dotted lines is attributed to the absorption loss in the substrate. For the case where d3=3 mm, near-unity absorption in the microwave range is achieved, and an average visible transmittance of 65% can still be maintained. It is important to note that the transparency of the GDS cavity formed in accordance with certain aspect of the present disclosure can be further improved by removing the PET substrate (~88.1%) and adopting one whole stack of dielectric spacer in-between (reducing reflection loss at air/silica interfaces), and the theoretical maximal visible transmittance for GDS cavity is nearly 87%.

In various aspects, the present disclosure provides methods for broadband electromagnetic interference (EMI) shielding by employing a stack having an ultrathin and smooth doped silver film. Further, transparent conductive dielectric layers are employed as optical anti-reflection layers in combination with the ultrathin and smooth doped silver film to improve shielding performance, while simultaneously avoiding sacrificing optical transmittance. Moreover, fabrication of the structure involves material deposition processes alone, which greatly reduces the complexity and cost for making such structures, such that it is possible to fabricate the large-area devices at high volume throughput.

In summary, the present disclosure provides an electromagnetic interference (EMI) shielding (EMAGS) film stack structure, in the form of an assembly of dielectric-conductive metal-dielectric layers, which in certain variations can transmit over 96% visible light relative to the underlying substrate and shows an excellent EMI shielding effectiveness of at least about 6 dB over a broad bandwidth of 32 GHz, covering the entire X, $K_u$, K and K bands. Other embodiments provide EMI shielding effectiveness of greater than or equal to about 30 dB by assembling two EMAGS film stacks films together. The EMI shielding effectiveness can be further improved up to 50 dB by separating two stacks with a quarter-wavelength spacer layer. Such an electromagnetic interference (EMI) shielding (EMAGS) film stack structure is also flexible and demonstrates a stable EMI shielding performance under mechanical deformation. In addition, large-area electromagnetic interference (EMI) shielding (EMAGS) film stack structures can be formed on a roll-to-roll sputtering system for mass-production. A graphene layer or other ultra-thin conducting layer can be placed above the Ag-alloy layer to achieve RF absorption, which provides additional form of EMI shielding.

The present disclosure also contemplates a transparent electromagnetic interference (EMI) shielding device that can provide near-unity absorption when used as a microwave absorber. The transparent electromagnetic interference (EMI) shield assembly based on an asymmetric Fabry-Pérot cavity can include a stack comprising graphene, a transparent spacer layer, and an ultrathin-doped Ag. The experimental results are in good agreement with the theoretical predictions. The physical origin of these phenomenal features is understood by rigorous investigations of critical coupling modes supported by the asymmetric Fabry-Pérot cavity. Experimental results show a maximal absorption up to about 99.5% at 13.75 GHz with an average visible transmittance of 65% in select embodiments. In addition, the GDS resonator cavity can be easily tuned by electrical gating (described in the context of FIG. 3) or chemical doping for the graphene layer or simply altering the cavity thickness. Such transparent electromagnetic interference (EMI) shield devices can be used in transparent microwave absorbing applications and thus have broad applicability for novel microwave optical components.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for broadband electromagnetic interference (EMI) shielding comprising:
   disposing an electromagnetic shield in a transmission path of electromagnetic radiation for blocking a range of frequencies of greater than or equal to about 600 MHz to less than or equal to about 90 GHz to a shielding efficiency of greater than or equal to 20 dB, while transmitting a range of wavelengths in a visible range of greater than or equal to about 390 nm to less than or equal to about 740 nm to an average visible transmission efficiency of greater than or equal to about 65% through the electromagnetic shield, wherein the electromagnetic shield includes a flexible stack comprising:
   a continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths;
   a first conductive layer disposed adjacent to the first side of the continuous metal film, wherein the first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof; and
   a second conductive layer disposed adjacent to the opposite second side of the continuous metal film, wherein the second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof.

2. The method of claim 1, wherein the electromagnetic shield further comprises a graphene layer.

3. The method of claim 2, wherein the graphene layer comprises at least one dopant.

4. The method of claim 2, wherein the electromagnetic shield further comprises at least one spacer layer comprising a dielectric material disposed between the graphene layer and the second conductive layer of the flexible stack.

5. The method of claim 4, wherein the at least one spacer layer has a thickness corresponding to a quarter of peak wavelength of electromagnetic radiation in the range of frequencies of greater than or equal to about 800 MHz to less than or equal to about 90 GHz.

6. The method of claim 1, wherein the blocking is for the range of frequencies of greater than or equal to about 8 GHz to less than or equal to about 40 GHz to a shielding efficiency of greater than or equal to 26 dB.

7. The method of claim 1, wherein the electromagnetic shield further comprises a graphene layer that together with the flexible stack defines a resonator cavity, so that the blocking comprises absorbing the range of frequencies of greater than or equal to about 800 MHz to less than or equal to about 90 GHz within the resonator cavity so that a reflectivity of the electromagnetic shield is less than or equal to about 1%.

8. The method of claim 1, wherein the shielding efficiency is greater than or equal to 20 dB while the average visible transmission efficiency is greater than or equal to about 85%.

9. The method of claim 1, wherein the shielding efficiency is greater than or equal to 30 dB while the average visible transmission efficiency is greater than or equal to about 80%.

10. The method of claim 1, wherein the shielding efficiency is greater than or equal to 50 dB while the average visible transmission efficiency is greater than or equal to about 65%.

11. The method of claim 1, wherein the first conductive layer has a thickness of less than or equal to about 45 nm and the second conductive layer has a thickness of less than or equal to about 45 nm.

12. The method of claim 1, wherein the flexible stack further comprises a substrate that is transmissive to the range of wavelengths.

13. The method of claim 1, wherein the flexible stack has a sheet resistance ($R_s$) of less than or equal to 20 Ohm/square after greater than or equal to about 250 cycles of bending.

14. A method for broadband electromagnetic shielding comprising:
    disposing an electromagnetic shield in a transmission path of electromagnetic radiation to block a range of frequencies of greater than or equal to about 800 MHz to less than or equal to about 90 GHz to a shielding efficiency of greater than or equal to 20 dB while transmitting a range of wavelengths in a visible range of greater than or equal to about 390 nm to less than or equal to about 740 nm to an average visible transmission efficiency of greater than or equal to about 65% through the electromagnetic shield, wherein the electromagnetic shield comprises:
    a first flexible stack comprising:
      a first continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths;

a first conductive layer disposed on the first side of the first continuous metal film, wherein the first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof;

a second conductive layer disposed on the opposite second side of the first continuous metal film, wherein the second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof;

a second flexible stack comprising:

a second continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths;

a third layer disposed on the first side of the second continuous metal film, wherein the third layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof;

a fourth layer disposed on the opposite second side of the second continuous metal film, wherein the fourth layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof; and a spacing layer comprising a dielectric material disposed between the first flexible stack and the second flexible stack.

15. The method of claim 14, wherein the spacing layer has a thickness corresponding to a quarter of peak wavelength of electromagnetic radiation in the range of frequencies of greater than or equal to about 800 MHz to less than or equal to about 90 GHz.

16. The method of claim 14, wherein the shielding efficiency is greater than or equal to 30 dB while the average visible transmission efficiency is greater than or equal to about 80%.

17. The method of claim 14, wherein the shielding efficiency is greater than or equal to 50 dB while the average visible transmission efficiency is greater than or equal to about 65%.

18. An electromagnetic interference (EMI) shield comprising:

a first flexible stack comprising:

a first continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to a range of wavelengths in a visible range of greater than or equal to about 390 nm to less than or equal to about 740 nm;

a first conductive layer disposed on the first side of the first continuous metal film, wherein the first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof;

a second conductive layer disposed on the opposite second side of the first continuous metal film, wherein the second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof;

a second flexible stack comprising:

a second continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square, that is substantially transparent to the range of wavelengths in the visible range of greater than or equal to about 390 nm to less than or equal to about 740 nm;

a third layer disposed on the first side of the second continuous metal film, wherein the third layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof;

a fourth layer disposed on the opposite second side of the second continuous metal film, wherein the fourth layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof; and a spacing layer comprising a dielectric material disposed between the first flexible stack and the second flexible stack.

19. An electromagnetic interference (EMI) shield comprising:

a continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square;

a first conductive layer disposed in contact with the first side of the continuous metal film, wherein the first conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof; and a second conductive layer disposed in contact with the opposite second side of the continuous metal film, wherein the second conductive layer comprises a conductive dielectric material selected from the group consisting of: indium tin oxide, aluminum tin oxide, indium zinc oxide, fluorine-doped tin oxide, poly(3,4-ethylenedioxythiophene) (PEDOT), and mixtures thereof; and a spacing layer comprising a dielectric material adjacent to the second conductive layer; and a graphene layer adjacent to the spacing layer.

20. The electromagnetic interference (EMI) shield of claim 19, further comprising an electrical gating system comprising a first terminal in electrical communication with the graphene layer, a second terminal in electrical communication with the continuous metal film, and a voltage source in electrical communication with the first terminal and the second terminal.

21. The electromagnetic interference (EMI) shield of claim 19, wherein the graphene layer comprises at least one dopant.

22. The electromagnetic interference (EMI) shield of claim 19, wherein the spacing layer has a thickness corresponding to a quarter of peak wavelength of electromagnetic radiation in a range of frequencies of greater than or equal to about 800 MHz to less than or equal to about 90 GHz.

23. The electromagnetic interference (EMI) shield of claim 19, wherein the continuous metal film has a thickness of less than or equal to about 10 nm, the first conductive layer has a thickness of less than or equal to about 45 nm and the second conductive layer has a thickness of less than or equal to about 45 nm.

24. The electromagnetic interference (EMI) shield of claim 19, wherein a shielding efficiency of the electromagnetic interference (EMI) shield to block a range of frequencies of greater than or equal to about 800 MHz to less than or equal to about 90 GHz to a shielding efficiency of greater than or equal to 20 dB is greater than or equal to 30 dB while an average transmission efficiency for a range of wavelengths in a visible range of greater than or equal to about 390 nm to less than or equal to about 740 nm is greater than or equal to about 80% through electromagnetic interference (EMI) shield.

25. The electromagnetic interference (EMI) shield of claim 19, wherein the graphene layer is a first graphene layer and the electromagnetic interference (EMI) shield further comprises a second graphene layer.

26. A method for broadband electromagnetic shielding comprising:

disposing an electromagnetic shield in a transmission path of electromagnetic radiation to block a range of frequencies of greater than or equal to about 800 MHz to less than or equal to about 90 GHz to a shielding efficiency of greater than or equal to 30 dB while transmitting a range of wavelengths in a visible range of greater than or equal to about 390 nm to less than or equal to about 740 nm to an average transmission efficiency of greater than or equal to about 80% through the electromagnetic shield, wherein the electromagnetic shield comprises:

a continuous metal film defining a first side and an opposite second side and comprising silver (Ag) at greater than or equal to about 80 atomic % and copper (Cu) at less than or equal to about 20 atomic % having a thickness of less than or equal to about 10 nm, a sheet resistance of less than or equal to about 20 Ohm/square;

a first conductive layer disposed in contact with the first side of the continuous metal film, wherein the first conductive layer comprises a conductive material selected from the group consisting of: indium tin oxide, aluminum zinc oxide (AZO), indium zinc oxide (IZO), fluorine-doped tin oxide (FTO), poly(3,4-ethylenedioxythiophene) (PEDOT), and mixtures thereof; and a second conductive layer disposed in contact with the opposite second side of the continuous metal film, wherein the second conductive layer comprises a conductive material selected from the group consisting of: indium tin oxide, aluminum zinc oxide (AZO), indium zinc oxide (IZO), fluorine-doped tin oxide (FTO), poly(3,4-ethylenedioxythiophene) (PEDOT), and mixtures thereof; and a spacing layer comprising a dielectric material adjacent to the second conductive layer; and a graphene layer adjacent to the spacing layer.

* * * * *